US010378785B2

(12) United States Patent
Kotake et al.

(10) Patent No.: US 10,378,785 B2
(45) Date of Patent: Aug. 13, 2019

(54) COMMUNICATION SYSTEM AND COMMUNICATION APPARATUS

(71) Applicant: Mitsubishi Electric Corporation, Tokyo (JP)

(72) Inventors: Hiroaki Kotake, Tokyo (JP); Yoshiaki Koizumi, Tokyo (JP); Takuya Mukai, Tokyo (JP); Masahiro Ishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 73 days.

(21) Appl. No.: 15/547,171

(22) PCT Filed: Apr. 1, 2015

(86) PCT No.: PCT/JP2015/060362
§ 371 (c)(1),
(2) Date: Jul. 28, 2017

(87) PCT Pub. No.: WO2016/157472
PCT Pub. Date: Oct. 6, 2016

(65) Prior Publication Data
US 2018/0019787 A1 Jan. 18, 2018

(51) Int. Cl.
*H04L 25/02* (2006.01)
*F24F 11/89* (2018.01)
(Continued)

(52) U.S. Cl.
CPC ............. *F24F 11/89* (2018.01); *H03H 11/28* (2013.01); *H04B 3/542* (2013.01); *H04B 3/56* (2013.01);
(Continued)

(58) Field of Classification Search
CPC ..... H04L 27/367; H04L 27/368; H04L 25/02; H04F 1/3241; H04F 1/3247; H03H 11/28;
(Continued)

(56) References Cited

FOREIGN PATENT DOCUMENTS

JP  03-077456  *  3/1991
JP  03-077456 A    4/1991
(Continued)

OTHER PUBLICATIONS

International Search Report of the International Searching Authority dated Jun. 30, 2015 for the corresponding international application No. PCT/JP2015/060362 (and English translation).

(Continued)

*Primary Examiner* — Kevin M Burd
(74) *Attorney, Agent, or Firm* — POSZ Law Group, PLC

(57) ABSTRACT

A communication system comprises a communication device and communication devices. The communication device comprises a direct current power supply and a transmitter configured to transmit data by control of a current flowing through a current loop. The communication devices comprise a receiver configured to receive data by detection of the current flowing through the current loop. The communication device comprises an adjuster configured to adjust the impedance between a signal line and a common line according to the number of communication devices.

20 Claims, 23 Drawing Sheets

(51) Int. Cl.
   *H04M 9/00* (2006.01)
   *H04Q 9/00* (2006.01)
   *H03H 11/28* (2006.01)
   *H04B 3/54* (2006.01)
   *H04B 3/56* (2006.01)
   *H02M 7/06* (2006.01)

(52) U.S. Cl.
   CPC .............. *H04L 25/02* (2013.01); *H04M 9/00* (2013.01); *H04Q 9/00* (2013.01); *H02M 7/06* (2013.01); *H04B 3/548* (2013.01)

(58) Field of Classification Search
   CPC ... H04B 3/56; H04M 9/00; F24F 11/89; F24F 11/88
   USPC .......................................................... 375/259
   See application file for complete search history.

(56) References Cited

FOREIGN PATENT DOCUMENTS

| | | | |
|---|---|---|---|
| JP | 04-315335 A | * | 11/1992 |
| JP | 04-315335 A | | 11/1992 |
| JP | 04-315336 | * | 11/1992 |
| JP | 04-315336 A | | 11/1992 |
| JP | 06-032878 A | * | 2/1994 |
| JP | 06-038278 A | | 2/1994 |
| JP | 2948502 B2 | | 7/1999 |
| JP | 2003-287265 A | | 10/2003 |
| JP | 2003287265 A | * | 10/2003 |
| JP | 2005-226868 A | | 8/2005 |

OTHER PUBLICATIONS

Office action dated Apr. 3, 2018 issued in corresponding JP patent application No. 2017-509088 (and English translation thereof).

* cited by examiner

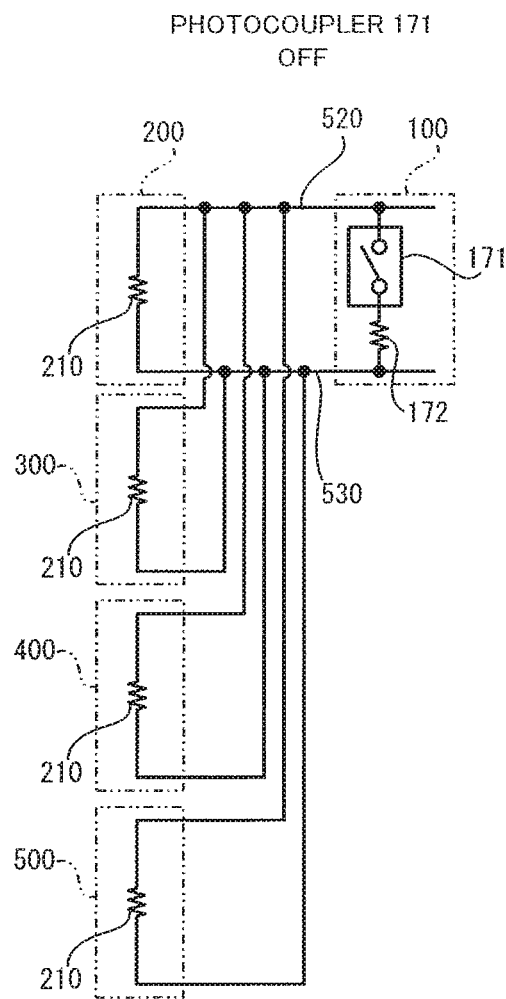

| SIA TERMINAL | SIB TERMINAL | SIC TERMINAL | SOA TERMINAL | SOB TERMINAL |
|---|---|---|---|---|
| L | L | L | H (PHOTOCOUPLER 171 IN ON STATE) | H (PHOTOCOUPLER 172 IN ON STATE) |
| H | L | L | H (PHOTOCOUPLER 171 IN ON STATE) | H (PHOTOCOUPLER 172 IN OFF STATE) |
| H | H | L | L (PHOTOCOUPLER 171 IN OFF STATE) | H (PHOTOCOUPLER 172 IN ON STATE) |
| H | H | H | L (PHOTOCOUPLER 171 IN OFF STATE) | H (PHOTOCOUPLER 172 IN OFF STATE) |

(A)

(B)

(C)

L H H L L L H H L L
RATE OF LEVEL L: 0.6

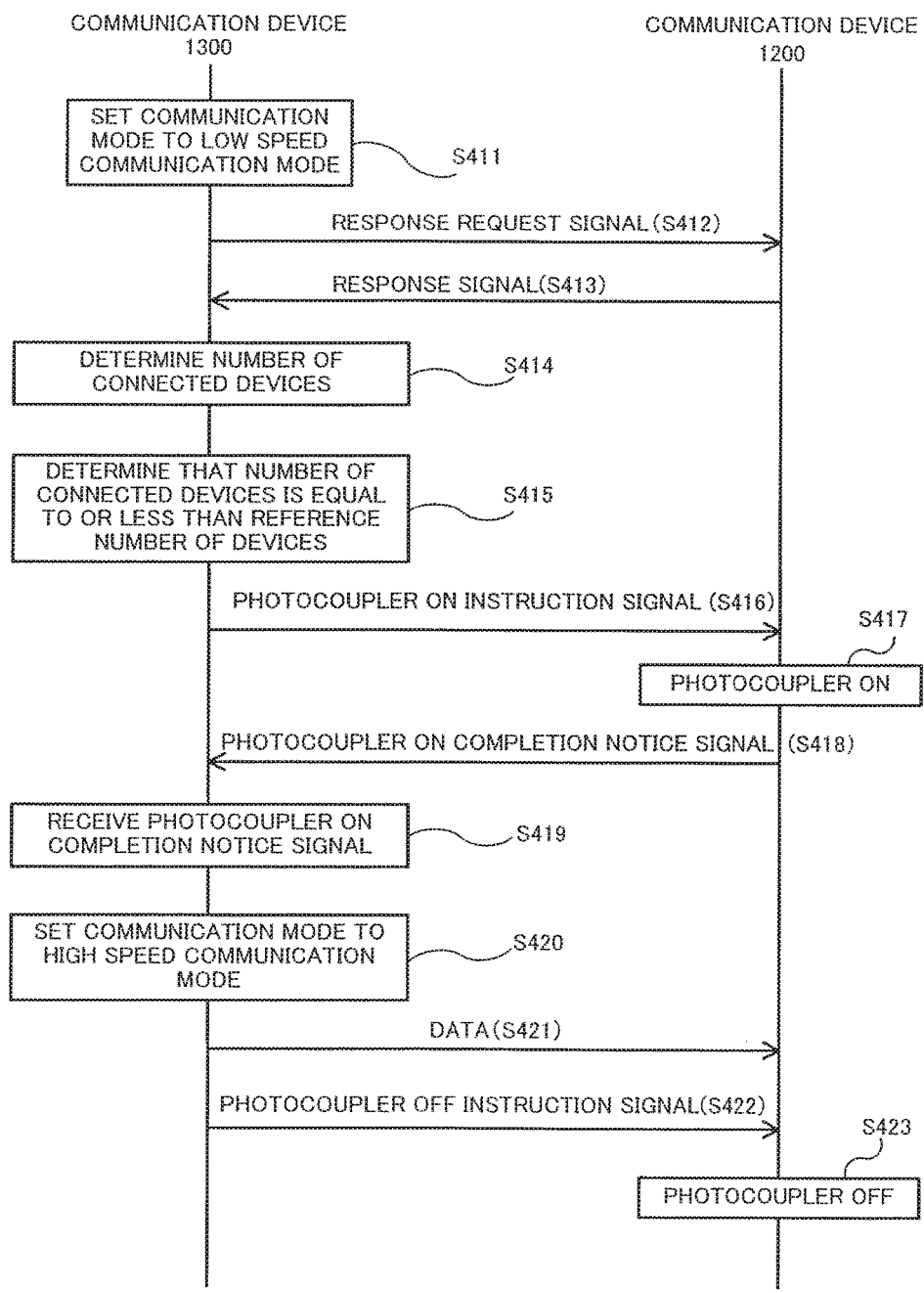

COMMUNICATION SYSTEM AND COMMUNICATION APPARATUS

CROSS REFERENCE TO RELATED APPLICATION

This application is a U.S. national stage application of International Patent Application No. PCT/JP2015/060362 filed on Apr. 1, 2015, the content of which is incorporated herein by reference.

TECHNICAL FIELD

The present disclosure relates to a communication system and a communication device conducting serial communication.

BACKGROUND ART

Communication systems in which multiple communication devices mutually communicate through serial communication using photocouplers are known. For example, Patent Literature 1 discloses an air conditioning apparatus of a so-called separate type in which multiple indoor units are connected in parallel to an outdoor unit via a pair of commercial power lines (a power line and a common line) and a signal line. In this air conditioning apparatus, the outdoor unit and the multiple indoor units mutually communicate through serial communication using a current loop including the signal line and the common line. Here, each indoor unit is provided with a resistor of a high resistance (approximately several kΩ to several tens kΩ) on the current loop for protecting the circuit element of each indoor unit in the event that the power supply is improperly connected to the signal line.

PATENT LITERATURE

Patent Literature 1: Japanese Patent No. 2948502.

However, in the configuration described in Patent Literature 1, particularly when the number of indoor units is low, the impedance between the signal line and the common line is increased. In such a case, when the outdoor unit shifts the state of the current loop to the cutoff state (the state in which no current flows), the inductive voltage occurring between the signal line and the common line is increased and the noise current due to the inductive voltage is also increased. Then, as the noise current is increased, the indoor units may falsely detect data.

SUMMARY

The present disclosure is made with the view of the above actual situation and an objective of the disclosure is to provide a communication system and a communication device capable of suppressing false detection of data.

In order to achieve the above objective, the communication system according to the present disclosure comprises:
a first communication device, and
at least one second communication device connected in parallel to the first communication device by a signal line, a common line, and a power line.
wherein
the first communication device comprises
a direct current power supply configured to generate a direct current for serial communication from alternating current power supplied from an alternating current power supply through the power line and the common line, and pass the generated direct current through a current loop comprising the signal line and the common line that are connected in series, and
a transmitter configured to transmit data by control of a current flowing through the current loop,
the at least one second communication device comprises a receiver configured to receive data by detection of the current flowing through the current loop, and
at least one device of the first communication device or the at least one second communication device further comprises an adjuster configured to adjust impedance between the signal line and the common line based on a number of the at least one second communication device.

According to the present disclosure, the adjuster adjusts the impedance between the signal line and the common line based on the number of second communication devices. Hence, according to the present disclosure, it is possible to suppress false detection of data.

BRIEF DESCRIPTION OF DRAWINGS

FIG. 3D is an equivalent circuit of the communication system according to Embodiment 1 when the number of connected devices is four;

FIG. 9 is a chart showing the control table according to Embodiment 2;

FIG. 19 is a sequence chart showing the operation of the communication system according to Embodiment 6.

DETAILED DESCRIPTION

The communication system device according to embodiments of the present disclosure will be described below with reference to the drawings.

(Embodiment 1)

(Configuration of the Communication System)

Figure 1:
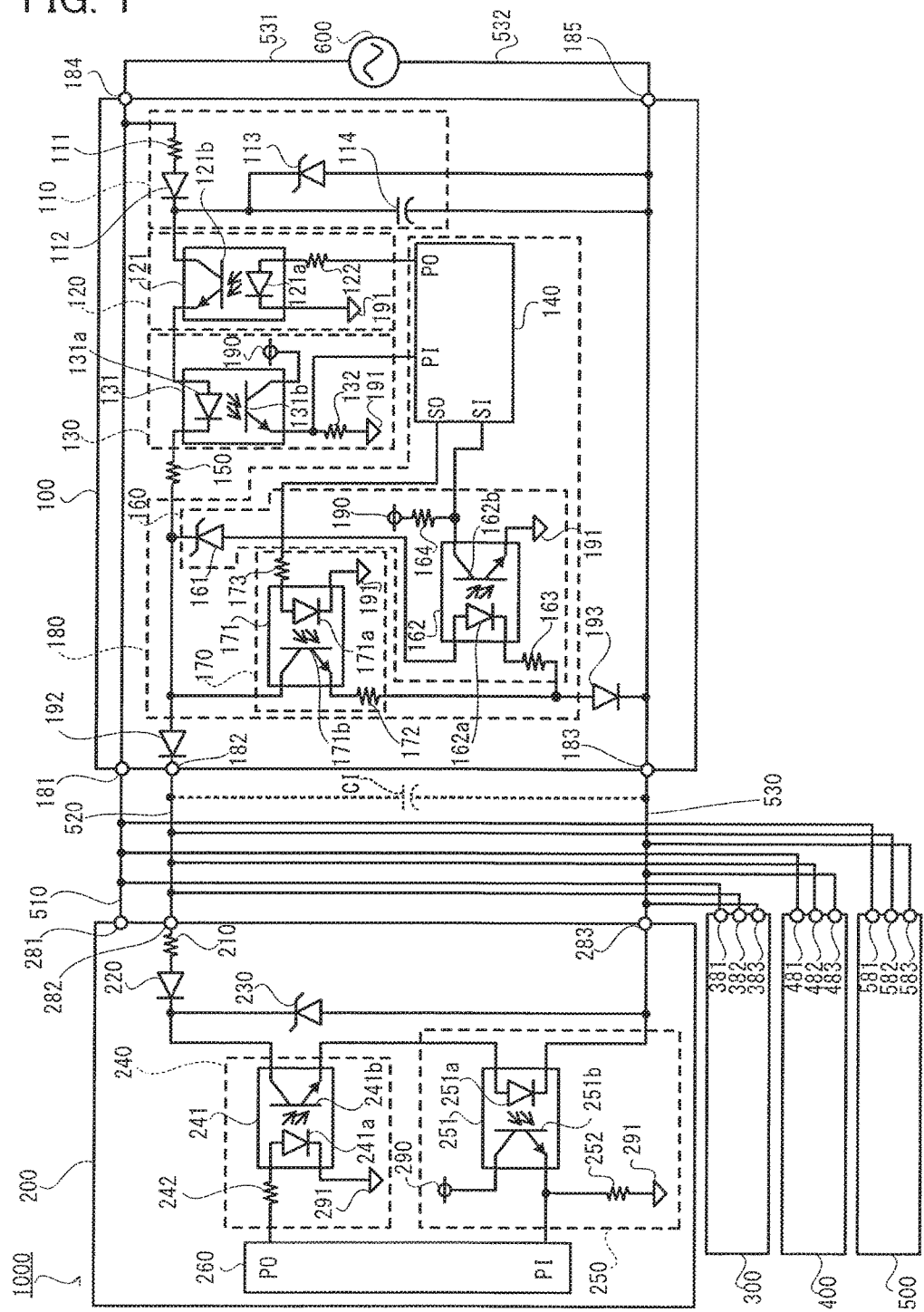
FIG. 1 is a configuration diagram of a communication system according to Embodiment 1.

First, the configuration of a communication system 1000 according to Embodiment 1 of the present disclosure will be described with reference to FIG. 1. As shown in FIG. 1, the communication system 1000 comprises a communication device 100, a communication device 200, a communication device 300, a communication device 400, and a communication device 500. In this embodiment, the communication system 1000 is an air conditioning system, the communication device 100 is an outdoor unit, and the communication device 200, the communication device 300, the communication device 400, and the communication device 500 are indoor units.

The communication devices 200, 300, 400, and 500 are connected mutually in parallel to the communication device 100 by a power line 510, a signal line 520, and a common line 530. A power supply potential of an alternating current power supply 600 is applied to the power line 510. A communication current supplied from a direct current power supply 110 described later flows through the signal line 520. Reference potentials of the alternating current power supply 600 and the direct current power supply 110 are applied to the common line 530. The alternating current power supply 600 is an alternating current power supply supplying alternating current power and, for example, a commercial power supply outputting a voltage of 200 V. The connection relationship between the components will specifically be described below.

The communication device 100 comprises a terminal 181, a terminal 182, a terminal 183, a terminal 184, and a terminal 185. The communication device 200 comprises a terminal 281, a terminal 282, and a terminal 283. The communication device 300 comprises a terminal 381, a terminal 382, and a terminal 383. The communication device 400 comprises a terminal 481, a terminal 482, and a terminal 483. The communication device 500 comprises a terminal 581, a terminal 582, and a terminal 583. The terminal 181 is connected to each of the terminal 281, the terminal 381, the terminal 481, and the terminal 581 by the power line 510. The terminal 182 is connected to each of the terminal 282, the terminal 382, the terminal 482, and the terminal 582 by the signal line 520. The terminal 183 is connected to each of the terminal 283, the terminal 383, the terminal 483, and the terminal 583 by the common line 530. As just stated, the communication device 200, the communication device 300, the communication device 400, and the communication device 500 are connected in parallel to communication device 100X) by each of the power line 510, the signal line 520, and the common line 530.

The terminal 184 is connected to one end (the L phase terminal) of the alternating current power supply 600 by a power line 531. The terminal 185 is connected to the other end (the N phase terminal) of the alternating current power supply 600 by a common line 532. In other words, the communication device 100 is supplied with alternating current power from the alternating current power supply 600 via the terminal 184 and the terminal 185. Moreover, the communication device 200 is supplied with alternating current power from the alternating current power supply 600 via the terminal 281 and the terminal 283. The communication device 300 is supplied with alternating current power from the alternating current power supply 600 via the terminal 381 and the terminal 383. The communication device 400 is supplied with alternating current power from the alternating current power supply 600 via the terminal 481 and the terminal 483. The communication device 500 is supplied with alternating current power from the alternating current power supply 600 via the terminal 581 and the terminal 583.

The power line 510 is an electric wire set to an L phase potential. The signal line 520 is an electric wire for passing a communication current from the communication device 100 to the communication device 200, the communication device 30X), the communication device 400, and the communication device 500. The common line 530 is an electric wire for returning the communication current to the communication device 100 from the communication device 200, the communication device 30X), the communication device 400, and the communication device 500 and an electric wire set to an N phase potential. In this embodiment, the power line 510, the signal line 520, and the common line 530 are collected and encased in one cable. Line-to-line capacitance CI is present between the signal line 520 and the common line 530. The line-to-line capacitance CI between the signal line 520 and the common line 530 increases in proportion to the length of the signal line 520. The capacitance of the line-to-line capacitance CI also varies depending on the material of the signal line 520 and is, for example, approximately 10000 pF when the length of the signal line 520 is approximately 100 m.

The method of transferring data in serial communication using communication current will be described next. The communication current is a current flowing through a current loop formed of the communication device 100→the signal line 520→the communication device of the other party of communication→the common line 530→the communication device 100. Here, the communication device of the other party of communication is at least one communication device among the communication device 200, the communication device 300, the communication device 400, and the communication device 500. When there are multiple communication devices of the other parties of communication, the communication current is divided and supplied to the communication devices of the other parties of communication and then combined and returned to the communication device 100.

Data transferred in serial communication are expressed in binary numbers defined by combinations of "1" and "0." When data are transferred from the communication device 100 to the communication device of the other party of communication, the communication device 100 passes or cuts off a communication current in each preset reference period based on the data to transmit. For example, the communication device 100 passes a communication current when "1" should be transmitted and cuts off a communication current when "0" should be transmitted. In such a case, a communication current being passed means that "1" is transmitted and a communication current being cut off means that "0" is transmitted.

The communication device of the other party of communication judges whether a communication current is present/absent in each reference period and recognizes binary data associated with presence/absence patterns of communication currents as data transmitted by the communication device 100. Here, the logic of "0" and "1" can be inverted as appropriate. Moreover, the state in which a communication current flows through the current loop is called the current loop conductive state and the state in which a communication current through the current loop is cut off is called the current loop non-conductive state. Moreover, a current loop conductive/non-conductive state refers to either the conductive state or the non-conductive state. Moreover, the conductive state is called the ON state as appropriate and the non-conductive state is called the OFF state as appropriate.

Moreover, when data are transferred from the communication device of the other party of communication to the communication device 100, the communication device of the other party of communication passes or cuts off a communication current in each reference period based on the data to transmit. Then, the communication device 100 judges whether a communication current is present/absent in each reference period and recognizes binary data associated with absence/presence patterns of communication currents as data transmitted by the communication device of the other party of communication.

Configurations of the communication devices 100, 200, 300, 400, and 500 will be described next. As shown in FIG. 1, the communication device 100 comprises a direct current power supply 110, a transmitter 120, a receiver 130, a controller 140, a resistor 150, and diodes 192 and 193. Moreover, the communication device 100 comprises a determiner 160 for determining the number of communication devices connected to the communication device 100 and a switcher 170 switching the state between the signal line 520 and the common line 530 between the state of connection via a resistor 172 (a first load resistor) and the state of disconnection via the resistor 172. The determiner 160, the switcher 170, and the controller 140 constitute an adjuster 180 adjusting the impedance between the signal line 520 and the common line 530 (called "the line-to-line impedance" hereafter) based on the number of communication devices (for example, 200, 300, 400, and 500) connected to the communication device 100.

The direct current power supply 110 is a direct current power supply supplying communication currents used in serial communication. The direct current power supply 110 converts alternating current power supplied from the alternating current power supply 600 via the terminal 184 and the terminal 185 to direct current power. The direct current power supply 110 outputs a communication voltage of a voltage Vc (V) on the basis of the potential of the common line 530. The direct current power supply 110 is a half-wave rectifier circuit comprising a resistor 111, a diode 112, an electrolytic capacitor 114, and a Zener diode 113.

The resistor 111 is a resistor for limiting the current flowing through the Zener diode 113. One end of the resistor 111 is connected to the terminal 184. The other end of the resistor 111 is connected to the anode of the diode 112. The cathode of the diode 112 is connected to the cathode of the Zener diode 113, the + terminal of the electrolytic capacitor 114, and the collector of a phototransistor 121b. The voltage (the breakdown voltage) between the ends of the Zener diode 113 is Vc (V). The anode of the Zener diode 113 is connected to the − terminal of the electrolytic capacitor 114, the cathode of the diode 193, the terminal 183, and the terminal 185. The electrolytic capacitor 114 is a capacitor smoothing the pulsating voltage and having the polarity.

The transmitter 120 is a circuit transmitting data by switching the current loop state between the state in which a communication current flows (the conductive state) and the state in which no communication current flows (the non-conductive state). In other words, the transmitter 120 is a circuit transmitting data by switching the current loop state between the state in which the current value of a communication current is higher than a communication current threshold and the state in which the current value is equal to or lower than the communication current threshold. Here, "the communication current threshold" is a prescribed threshold equal to or higher than zero. Specifically, the transmitter 120 passes a communication current through the transfer path while a parallel output (PO) terminal of the controller 140 is at a level of H and does not pass a communication current through the transfer path while the PO terminal is at a level L. Here, for example, the level H is 5V and the level L is 0V. The transmitter 120 comprises a photocoupler 121 and a resistor 122.

The photocoupler 121 is an element for electrically insulating two circuits from each other. The photocoupler 121 comprises a phototransistor 121b and a light emitting diode 121a In the photocoupler 121, when a primary side current flows through the light emitting diode 121a, a secondary side current flows through the current path of the phototransistor 121b. Hereafter, a current flowing through the light emitting diode 121a is called a primary side current and a current flowing through the phototransistor 121b is called a secondary side current. Moreover, a voltage applied to the light emitting diode 121a is called a primary side voltage and a voltage applied between the emitter and the collector of the phototransistor 121b is called a secondary side voltage.

The light emitting diode 121a allows a primary side current to flow and emits light at an intensity corresponding to the current value of the primary side current when the voltage value of the primary side voltage becomes equal to or higher than a threshold. The cathode of the light emitting diode 121a is connected to an earth terminal 191. The phototransistor 121b allows a secondary side current corresponding to the secondary side voltage and the emission intensity of the light emitting diode 121a to flow from the collector to the emitter.

The resistor 122 is a load resistor limiting the primary side current flowing from the controller 140 to the light emitting diode 121a.

Here, operation of the transmitter 120 is briefly described. First, it is assumed that the photocoupler 241 is kept in the ON state while the transmitter 120 transmits data. When the PO terminal of the controller 140 is at the level H, a current flows through the light emitting diode 121a via the resistor 122. Therefore, the photocoupler 121 is put in the ON state and a communication current flows through the transfer path. On the other hand, when the PO terminal of the controller 140 is at the level L, no current flows through the light emitting diode 121a. Therefore, the photocoupler 121 is put in the OFF state and no communication current flows through the transfer path.

The receiver 130 is a circuit receiving data by detection of the presence/absence of a communication current flowing through the current loop. In other words, the receiver 130 is a circuit receiving data by judging whether the current value of a communication current flowing through the current loop is higher than a communication current threshold or equal to or lower than the communication current threshold. Specifically, the receiver 130 sets a parallel input (PI) terminal of the controller 140 to the level H while a communication current flows through the transfer path and sets the PI terminal to the level L while no communication current flows through the transfer path. The receiver 130 comprises a photocoupler 131 and a resistor 132.

The photocoupler 131 has basically the same configuration as the photocoupler 121. The photocoupler 131 comprises a light emitting diode 131a and a phototransistor 131b. In the photocoupler 131, when a primary side current flows through the light emitting diode 131a, a secondary side current flows through the current path of the phototransistor 131b. The above-mentioned communication current threshold is set based, for example, on the minimum current value that should be passed through the light emitting diode 131a for putting the phototransistor 131b in the ON state.

The resistor 132 is a load resistor limiting the current flowing through the phototransistor 131b. A power supply terminal 190 is a terminal connected to a direct current power supply (not shown) other than the direct current power supply 110. This direct current power supply is configured by, for example, a reference voltage source generating a specific reference voltage by rectifying/smoothing the alternating current and lowering the ac voltage supplied from the alternating current power supply 600. The potential of the power supply terminal 190 is at the Level H (for example, 5V). The earth terminal 191 is a terminal kept at the ground potential.

Here, operation of the receiver 130 is briefly described. As a communication current flows through the transfer path, a current flows through the light emitting diode 131a and the photocoupler 131 is put in the ON state. Therefore, a current flows from the power supply terminal 190 to the earth terminal 191 via the phototransistor 131b and the resistor 132. Thus, the voltage between the ends of the resistor 132 is applied to the PI terminal of the controller 140 and the PI terminal reaches the level H. On the other hand, when no communication current flows through the transfer path, no current flows through the light emitting diode 131a and the photocoupler 131 is put in the OFF state. Thus, the PI terminal is pulled down to the earth potential by the resistor 132 and the PI terminal reaches the level L.

The controller 140 transmits data by controlling the photocoupler 121. Moreover, the controller 140 receives data based on the state of the photocoupler 131. Furthermore, the controller 140 switches to pass/cut off the current through the resistor 172 by controlling the photocoupler 171. Moreover, the controller 140 determines whether the number of communication devices connected to the communication device 100 is equal to or lower than a reference number of devices described later based on the state of a photocoupler 162 of the determiner 160. The controller 140 comprises a PO terminal and a serial output (SO) terminal outputting a voltage of the level H or the level L, and a PI terminal and a serial input (SI) terminal to which a voltage of the level H or the level L is applied. The controller 140 switches the level of the voltage of the PO terminal between the level H and the level L based on the data to transmit. Moreover, the controller 140 switches the voltage level of the SO terminal to the level H for passing a current through the resistor 172 and switches the voltage level of the SO terminal to the level L for cutting off a current flowing through the resistor 172. Furthermore, the controller 140 judges at which level the voltage applied to the P1 terminal and the SI terminal is, the level H or the level L.

The resistor 150 is a limiting resistor limiting the current flowing through the transfer path. As a result, the resistor 150 plays the role of protecting the circuit elements of the transmitter 120, the receiver 130, the determiner 160, and the switcher 170. The resistance of the resistor 150 is sufficiently low compared to the resistance of the resistor 210 provided to each of the communication devices 200, 300, 400, and 500. As a result, voltage drop due to the resistor 150 is less influential and sufficient communication currents can be supplied to the communication devices 200, 300, 400, and 500.

The diode 192 and the diode 193 are rectifying elements passing a current only in the direction from the anode to the cathode. The diode 192 and the diode 193 cut off reverse currents that may flow through the transfer path due to wrong wiring or the like. As a result, the diode 192 and the diode 193 play the role of protecting the circuit elements of the transmitter 120, the receiver 130, the determiner 160, and the switcher 170. The cathode of the diode 192 is connected to the terminal 182 and the cathode of the diode 193 is connected to the terminal 183.

The determiner 160 is a circuit determining whether the number of communication devices connected to the communication device 100 (for example, the communication devices 200, 300, 400, and 500) is equal to or less than a preset reference number of devices. The reference number of devices is set based, for example, on the resistors 210 of the communication devices connected to the communication device 100 (for example, the communication devices 200, 300, 400, and 500) and the line-to-line capacitance between the signal line 520 and the common line 530. The determiner 160 comprises a Zener diode 161, a photocoupler 162, a resistor 163, and a resistor 164. The controller 140 determines whether the number of communication devices connected to the communication device 100 is equal to or less than a preset reference number of devices (two devices in this embodiment) by means of the determiner 160.

The Zener diode 161 is put in the ON state when the voltage between the signal line 520 and the common line 530 exceeds a Zener voltage. The reference number of devices can be changed by replacing the Zener diode 161 with one having a different Zener voltage. The anode of the Zener diode 161 is connected to the anode of the light emitting diode 162a The photocoupler 162 has basically the same configuration as the photocoupler 121. The photocoupler 162 comprises a light emitting diode 162a and a phototransistor 162b. When a primary side current flows through the light emitting diode 162a, a secondary side current flows through the current path of the phototransistor 162b. The anode of the light emitting diode 162a is connected to the anode of the Zener diode 161.

The resistor 163 is a load resistor limiting the current flowing through the light emitting diode 162a The resistor 163 is connected at one end to the cathode of the light emitting diode 162a and at the other end to the anode of the diode 193. The resistance of the resistor 163 is sufficiently high compared to the resistance of the resistor 210 provided to each of the communication devices 200, 300, 400, and 500. When the Zener diode 161 is put in the ON state, a current flows through the resistor 163.

The resistor 164 is a pull-up resister and connected at one end to the power supply terminal 190 and at the other end to the serial input (SI) terminal of the controller 140 and the collector of the phototransistor 162b. When the phototransistor 162b is in the OFF state, the SI terminal is kept at the level H equal to the potential of the power supply terminal 190. When a current flows through the light emitting diode 162a and the phototransistor 162b is put in the ON state, the SI terminal reaches the level L that is a potential higher than the earth terminal 191 by the voltage drop of the phototransistor 162b.

The switcher 170 is a circuit for connecting the resistor (load) 172 between the signal line 520 and the common line 530. The switcher 170 comprises a photocoupler 171, a resistor 172, and a resistor 173. When the number of connected devices is equal to or less than the reference number of devices (two devices), the controller 140 controls the switcher 170 to connect the resistor 172 between the signal line 520 and the common line 530. On the other hand, when the number of connected devices is higher than the reference number of devices, the controller 140 does not connect the resistor 172 between the signal line 520 and the common line 530.

The photocoupler 171 has basically the same configuration as the photocoupler 121. The photocoupler 171 comprises a light emitting diode 171a and a phototransistor 171b. When a primary side current flows through the light emitting diode 171a, a secondary side current flows through the current path of the phototransistor 171b. The cathode of the light emitting diode 171a is connected to the earth terminal 191. The collector of the phototransistor 171b is connected to the cathode of the light emitting diode 131a, the cathode of the Zener diode 161, and the resistor 150.

The resistor 172 is a load resistor for adjusting the line-to-line impedance. The resistor 172 is connected at one end to the emitter of the phototransistor 171b and at the other end to the anode of the diode 193. The resistance of the resistor 172 is set, for example, lower than the resistance of the resistor 210 provided to each of the communication devices 200, 300, 400, and 500. The resistance of the resistor 172 is set, for example, to a magnitude of ½ of the resistance of the resistor 210.

The resistor 173 is a load resistor limiting the current flowing from the controller 140 to the light emitting diode 171a. The resistor 173 is connected at one end to the SO terminal of the controller 140 and at the other end to the anode of the light emitting diode 171a.

The communication device 200 comprises a transmitter 240, a receiver 250, a controller 260, a resistor 210, a diode 220, and a Zener diode 230.

The transmitter 240 is a circuit transmitting data by switching the current loop state between the state in which a communication current flows (the conductive state) and the state in which no communication current flows (the non-conductive state). Specifically, the transmitter 240 passes a communication current through the transfer path while the PO terminal of the controller 260 is at the level H and does not pass a communication current through the transfer path while the PO terminal is at the level L. The transmitter 240 comprises a photocoupler 241, a resistor 242, and an earth terminal 291.

The photocoupler 241 has basically the same configuration as the photocoupler 121. The photocoupler 241 comprises a light emitting diode 241a and a phototransistor 241b. When a primary side current flows through the light emitting diode 241a, a secondary side current flows through the current path of the phototransistor 241b. The cathode of the light emitting diode 241a is connected to the earth terminal 291. The collector of the phototransistor 241b is connected to the cathode of the diode 220 and the cathode of the Zener diode 161.

The resistor 242 is a load resistor limiting the primary side current flowing through the light emitting diode 241a. The resistor 242 is connected at one end to the anode of the light emitting diode 241a and at the other end to the PO terminal of the controller 260. The earth terminal 291 is a terminal kept at the earth potential.

Here, operation of the transmitter 240 is briefly described. First, it is assumed that the photocoupler 121 is kept in the ON state when the transmitter 240 transmits data. When the PO terminal of the controller 260 is at the level H, a current flows through the light emitting diode 241a via the resistor 242. Therefore, the photocoupler 241 is put in the ON state and a communication current flows through the transfer path. On the other hand, when the PO terminal of the controller 260 is at the level L, no current flows through the light emitting diode 241a Therefore, the photocoupler 241 is put in the OFF state and no communication current flows through the transfer path.

The receiver 250 is a circuit receiving data by detection of the presence/absence of a communication current flowing through the current loop. Specifically, the receiver 250 sets the PI terminal of the controller 260 to the level H while a communication current flows through the current loop and sets the PI terminal to the level L while no communication current flows through the transfer path. The receiver 250 comprises a photocoupler 251, a resistor 252, a power supply terminal 290, and an earth terminal 291.

The photocoupler 251 has basically the same configuration as the photocoupler 121. The photocoupler 251 comprises a light emitting diode 251a and a phototransistor 251b. When a primary side current flows through the light emitting diode 251a, a secondary side current flows through the current path of the phototransistor 251b. The anode of the light emitting diode 251a is connected to the emitter of the phototransistor 241b. The cathode of the light emitting diode 251a is connected to the anode of the Zener diode 230 and the terminal 283. The collector of the phototransistor 251b is connected to the power supply terminal 290.

The resistor 252 is a load resistor limiting the current flowing through the phototransistor 251b. The power supply terminal 290 is a terminal connected to a direct current power supply (not shown). The potential of the power supply terminal 290 is the Level H (for example, 5V). The earth terminal 291 is a terminal kept at the earth potential. The resistor 252 is connected at one end to the emitter of the phototransistor 251b and the PI terminal of the controller 260 and at the other end to the earth terminal 291.

Here, operation of the receiver 250 is briefly described. When a communication current flows through the transfer path, a current flows through the light emitting diode 251a and the photocoupler 251 is put in the ON state. Therefore, a current flows from the power supply terminal 290 to the earth terminal 291 via the phototransistor 251b and the resistor 252. At this point, the voltage occurring between the ends of the resistor 252 is entered into the PI terminal of the controller 260 and the PI terminal reaches the level H. On the other hand, when no communication current flows through the transfer path, no current flows through the light emitting diode 251a and the photocoupler 251 is put in the OFF state. Thus, the PI terminal is pulled down to the earth potential by the resistor 252 and the P1 terminal reaches the level L.

The controller 260 transmits data by controlling the photocoupler 241. Moreover, the controller 260 receives data based on the state of the photocoupler 251. The controller 260 comprises a PO terminal outputting a voltage of the level H or the level L and a PI terminal into which a voltage of the level H or the level L is entered. The controller 260 switches the level of the voltage output from the PO terminal between the level H and the level L based on data to be transmitted. Moreover, the controller 260 judges at which level the voltage entered into the PI terminal is, the level H or the level L.

The resistor 210 is a limiting resistor assembled in the current loop and limiting the communication current flowing through the transfer path within the communication devices 200, 300, 400, and 500. The resistor 210 plays the role of protecting the circuit elements of the transmitter 240 and the receiver 250 of the communication device 200. The resistance of the resistor 210 is set, for example, to a magnitude in a range from several kΩ to several tens kΩ.

The diode 220 is a rectifying element passing a current only in the direction from the anode to the cathode. The diode 220 plays the role of cutting off a reverse current that may flow through the transfer path due to wrong wiring or the like. The Zener diode 230 is a diode in which almost no reverse current flows when the reverse voltage applied between the anode and the cathode is lower than the breakdown voltage and a reverse current abruptly starts to flow when the reverse voltage becomes equal to or higher than the breakdown voltage. The Zener diode 230 plays the role of protecting the circuit elements of the transmitter 240 and the receiver 250 of the communication device 200 when an excess voltage or a reverse voltage is applied between the terminal 282 and the terminal 283 due to wrong wiring or the like.

The communication device 300, the communication device 400, and the communication device 500 each have the same configuration as the communication device 200. In other words, the communication device 300, the communication device 400, and the communication device 500 each communicate with the communication device 100 via the signal line 520 and the common line 530.

(Operation of the Communication System 1000)

Operations of the communication device 100 and the communication devices 200, 300, 400, and 500 when the communication device 100 and the communication devices 200, 300, 400, and 500 communicate through serial communication via the signal line 520 and the common line 530 will be described next. First, operation when the communication device 100 transmits data to at least one of the communication devices 200, 300, 400, and 500 will be described.

First, before the controller 140 of the communication device 100 transmits data, the determiner 160 determines whether the number of communication devices connected to the communication device 100 (the number of connected devices) is equal to or less than a preset reference number of devices (two devices). The number of connected devices corresponds to the number of communication devices connected to the communication device 100 via the signal line 520 and the common line 530. For example, when only two communication devices 200 and 300 are connected to the communication device 100, the photocoupler 162 of the determiner 160 is put in the ON state and the controller 140 determines that the number of connected devices is equal to or less than the reference number of devices (two devices). On the other hand, when the four communication devices 200, 300, 400, and 500 are all connected to the communication device 100, the photocoupler 162 is put in the OFF state and the controller 140 determines that the number of connected devices is higher than the reference number of devices (two devices).

Next, the controller 140 connects the resistor (the first load resistor) 172 between the signal line 520 and the common line 530 by means of the switcher 170 based on the number of connected devices. Specifically, when the number of connected devices is equal to or less than the reference number of devices, the controller 140 connects the resistor 172 between the signal line 520 and the common line 530 by means of the switcher 170 so as to lower the line-to-line impedance. On the other hand, when the he number of connected devices is higher than the reference number of devices, the controller 140 does not connect the resistor 172 between the signal line 520 and the common line 530 so as not to change the line-to-line impedance.

Subsequently, the controller 140 puts the photocoupler 121 of the transmitter 120 in the ON state or in the OFF state in each preset reference period based on data to transmit so as to pass or cut off the communication current. The receiver 250 of the other party of communication of the communication device 100 receives data.

Subsequently, after finishing data transmission, if the resistor 172 is connected between the signal line 520 and the common line 530, the controller 140 restores the state of the resistor 172 not being connected between signal line 520 and the common line 530 so as to return the line-to-line impedance back to the original magnitude.

Operation when any of the communication devices 200, 300, 400, and 50X) transmits data to the communication device 100 will be described next.

After finishing reception of data transmitted by the communication device 100, the communication devices 200, 300, 400, and 500 transmit data to the communication device 100 at a time assigned to each of the communication devices 200, 300, 400, and 500. The communication devices 200, 300, 400, and 500 keep the photocoupler 241 of the transmitter 240 in the OFF state while the other communication devices transmit. After finishing data transmission, the communication device 100 keeps the photocoupler 121 of the transmitter 120 in the ON state.

For example, it is assumed that the communication device 200 transmits data to the communication device 100 in a time slot assigned to the communication device 200. In such a case, the communication device 200 puts the photocoupler 241 of the transmitter 240 in the ON state or in the OFF state in each preset reference period based on data to transmit so as to pass or cut off the communication current. At this time, the communication device 100 receives the data transmitted by the communication device 200 by means of the receiver 130. The other communication devices 300, 400, and 500 transmit data to the communication device 100 in the same manner.

Operation of the determiner 160 of the communication device 100 to determine whether the number of the communication devices connected to the communication device 100 (the number of communication devices of other parties of communication) is equal to or less than a preset reference number of devices will be described next.

The communication device 100 puts the photocoupler 121 of the transmitter 120 in the ON state. In such a case, the communication voltage Vc output by the direct current power supply 110 is divided between the resistor 150 of the communication device 100 and the combined resistance of all resistors 210 provided to the communication devices 200, 300, 400, and 500 connected to the communication device 100.

When the photocoupler 121 is OFF, no current flows through the signal line 520 and therefore the potential of the signal line 520 is unstable. Consequently, the potential of the signal line 520 fluctuates under the influence of the alternating current voltage applied to the power line 510. This fluctuating potential of the signal line 520 generates an inductive voltage VI between the signal line 520 and the common line 530. The inductive voltage VI is increased as the line-to-line capacitance between the power line 510 and the signal line 520 is increased and increased as the impedance between the signal line 520 and the common line 530 is increased. Thus, as the magnitude of the line-to-line impedance is smaller, the inductive voltage VI is diminished and the noise current outflowing to the receiver 250 of the other party of communication becomes smaller. In this embodiment, it is assumed that the line-to-line impedance between the signal line 520 and the common line 530 is mostly determined by the resistance of the load resistor between the signal line 520 and the common line 530. Thus, in this embodiment, adjusting the line-to-line impedance between the signal line 520 and the common line 530 basically means adjusting the load resistor between the signal line 520 and the common line 530.

Figure 2A:
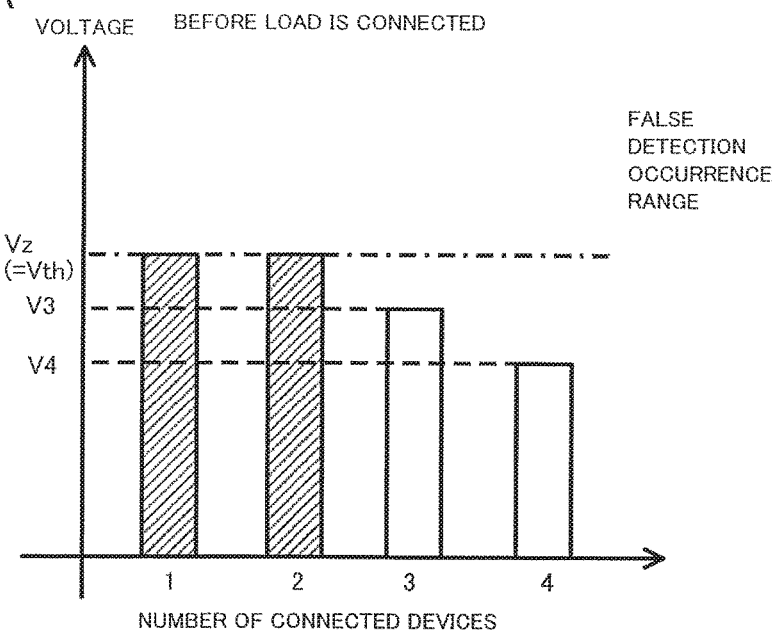
FIG. 2A is a chart showing the voltage between the signal line and the common line before a load is connected in the communication system according to Embodiment 1.

In the communication device 100 according to this embodiment, the determiner 160 can determine whether the number of communication devices connected to the communication device 100 is equal to or less than two. The Zener voltage Vz of the Zener diode 161 is selected so as to be put in the ON state when the number of connected devices is equal to or less than two and to be put in the OFF state when the number is equal to or higher than three. Here, the Zener voltage Vz is set, for example, to a threshold voltage Vth corresponding to the lower limit of a voltage range in which false detection occurs at the receiver 250 of the communication devices (for example, 200, 300, 400, and 500) connected to the communication device 100. For example as shown in FIG. 2A, the voltage between the signal line 520 and the common line 530 is equal to the Zener voltage Vz when the number of connected devices is one or two, a voltage V3 lower than the Zener voltage Vz when the number of connected devices is three, and a voltage V4 lower than the voltage V3 when the number of connected devices is four. In FIG. 2A, the resistor 173 (a load) is not yet connected between the signal line 520 and the common line 530. When the number of connected devices is equal to or less than two, a reverse current flows through the Zener diode 161 and a current flows through the light emitting diode 162a of the photocoupler 162 and the resistor 163. As a result, the light emitting diode 162a emits light, a current flows through the phototransistor 162b and the resistor 164, and the SI terminal of the controller 140 reaches the level L. On the other hand, when the number of connected devices is equal to or higher than three, no reverse current flows through the Zener diode 161 and the phototransistor 162b of the photocoupler 162 keeps the OFF state. Therefore, the SI terminal of the controller 140 keeps the state of being pulled up by the resistor 164, and the SI terminal of the controller 140 is kept at the level H. The controller 140 determines whether the number of connected devices is equal to or less than two based on the voltage level of the SI terminal.

Operation of the switcher 170 of the communication device 100 to switch the state between the signal line 520 and the common line 530 between the state of connection via the resistor 172 and the state of disconnection via the resistor 172 will be described next.

Figure 3A:
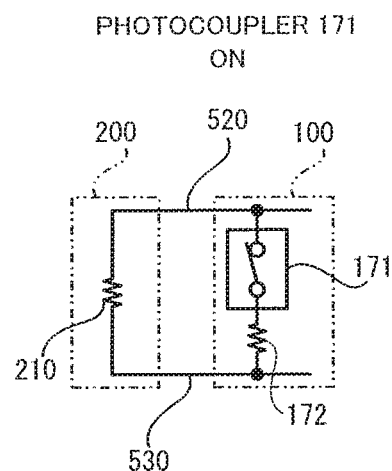
FIG. 3A is an equivalent circuit of the communication system according to Embodiment 1 when the number of connected devices is one.
Figure 3B:
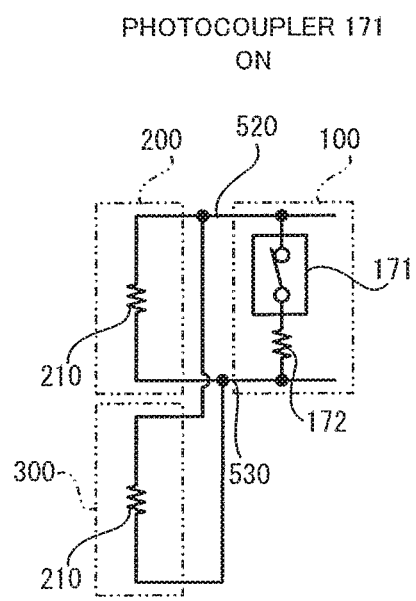
FIG. 3B is an equivalent circuit of the communication system according to Embodiment 1 when the number of connected devices is two.

The controller 140 connects or does not connect the resistor 172 between the signal line 520 and the common line 530 by switching the photocoupler 171 of the switcher 170 either to the ON state or to the OFF state. The controller 140 outputs a voltage of the level H from the SO terminal when the SI terminal is at the level L (when the number of connected devices is equal to or less than two). As a result, the photocoupler 171 is put in the ON state and the resistor 172 is connected between the signal line 520 and the common line 530. When the number of connected devices is one as in FIG. 3A, the photocoupler 171 is put in the ON state and the resistor 172 is connected in parallel to the resistor 210 of the communication device 200. Moreover, also when the number of connected devices is two as shown in FIG. 3B, the photocoupler 171 is put in the ON state and the resistor 172 is connected in parallel to the resistor 210 of each of the communication device 200 and the communication device 300. Then, the resistance component of the line-to-line impedance becomes equal to the resistance of a parallel circuit comprising the resistor 172 and the resistor 210 of the communication device 200 or the resistance of a parallel circuit comprising the resistor 172 and the respective resistors 210 of the communication devices 200 and 300. In such a case, the magnitude of the line-to-line impedance is smaller compared to before the resistor 172 is connected between the signal line 520 and the common line 530. The resistor 172 can be considered to be a dummy communication device connected in parallel to the communication devices 200 and 300.

Figure 2B:
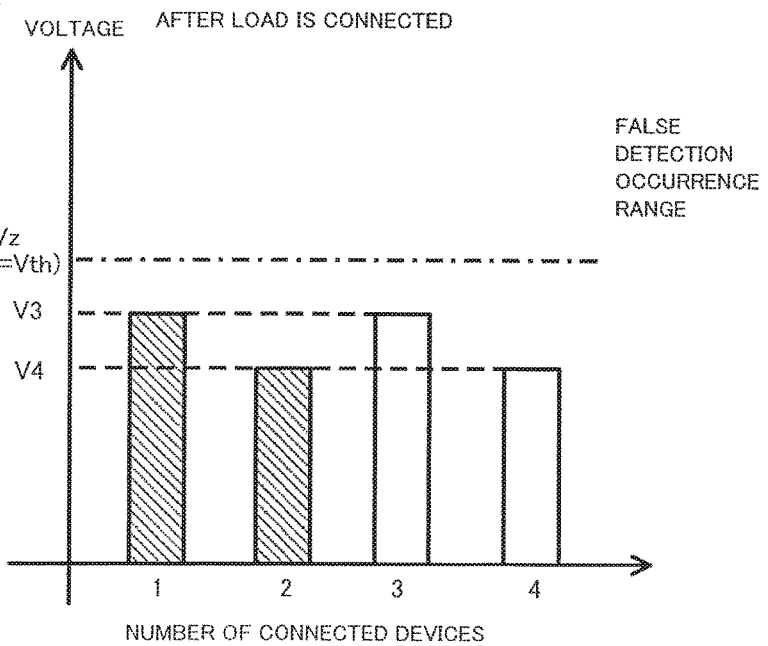
FIG. 2B is a chart showing the voltage between the signal line and the common line after a load is connected in the communication system according to Embodiment 1.

For example, it is assumed that the resistance of the resistor 210 of each of the communication devices 200, 300, 400, and 500 is R and the resistance of the resistor 172 is R/2. In such a case, the magnitude of the line-to-line impedance when the number of connected devices is one and the resistor 172 is connected is equal to the magnitude of the impedance when the number of connected devices is three and the resistor 172 is not connected, which is R/3. Moreover, the magnitude of the line-to-line impedance when the number of connected devices is two and the resistor 172 is connected is equal to the magnitude of the impedance when the number of connected devices is four and the resistor 172 is not connected, which is R/4. As a result, as shown in FIG. 2B, the voltage between the signal line 520 and the common line 530 after the resistor 172 is connected when the number of connected devices is one and two is equal to the voltage when the number of connected devices is three and four, respectively. At this point, the voltage between the signal line 520 and the common line 530 is lower than the Zener voltage Vz, whereby the Zener diode 161 is put in the OFF state.

Figure 3C:
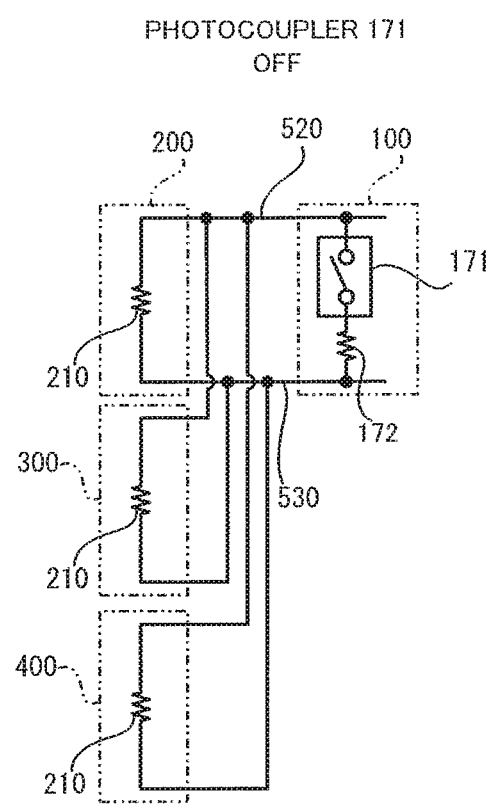
FIG. 3C is an equivalent circuit of the communication system according to Embodiment 1 when the number of connected devices is three.

On other hand, when the SI terminal is at the level H (when the number of connected devices is equal to or higher than three), the controller 140 outputs a voltage of the level L from the SO terminal. As a result, the photocoupler 171 is put in the OFF state and the resistor 172 is not connected between the signal line 520 and the common line 530. When the number of connected devices is three as in FIG. 3C, the photocoupler 171 keeps the OFF state and the magnitude of the line-to-line impedance is the combined impedance of the respective resistors 210 of the communication devices 200, 300, and 400. Moreover, also when the number of connected devices is four as shown in FIG. 3D, the photocoupler 171 keeps the OFF state and the magnitude of the line-to-line impedance is the combined impedance of the respective resistors 210 of the communication devices 200, 300, 400, and 500. In other words, the controller 140 controls the switcher 170 so that the state between the signal line 520 and the common line 530 is the state of connection via the resistor 172 based on whether the number of connected communication devices is equal to or less than the reference number of devices (two devices). As a result, the line-to-line impedance is equal to or lower than R/3 in any case of the number of connected devices being one, two, three, or four.

Figure 4:
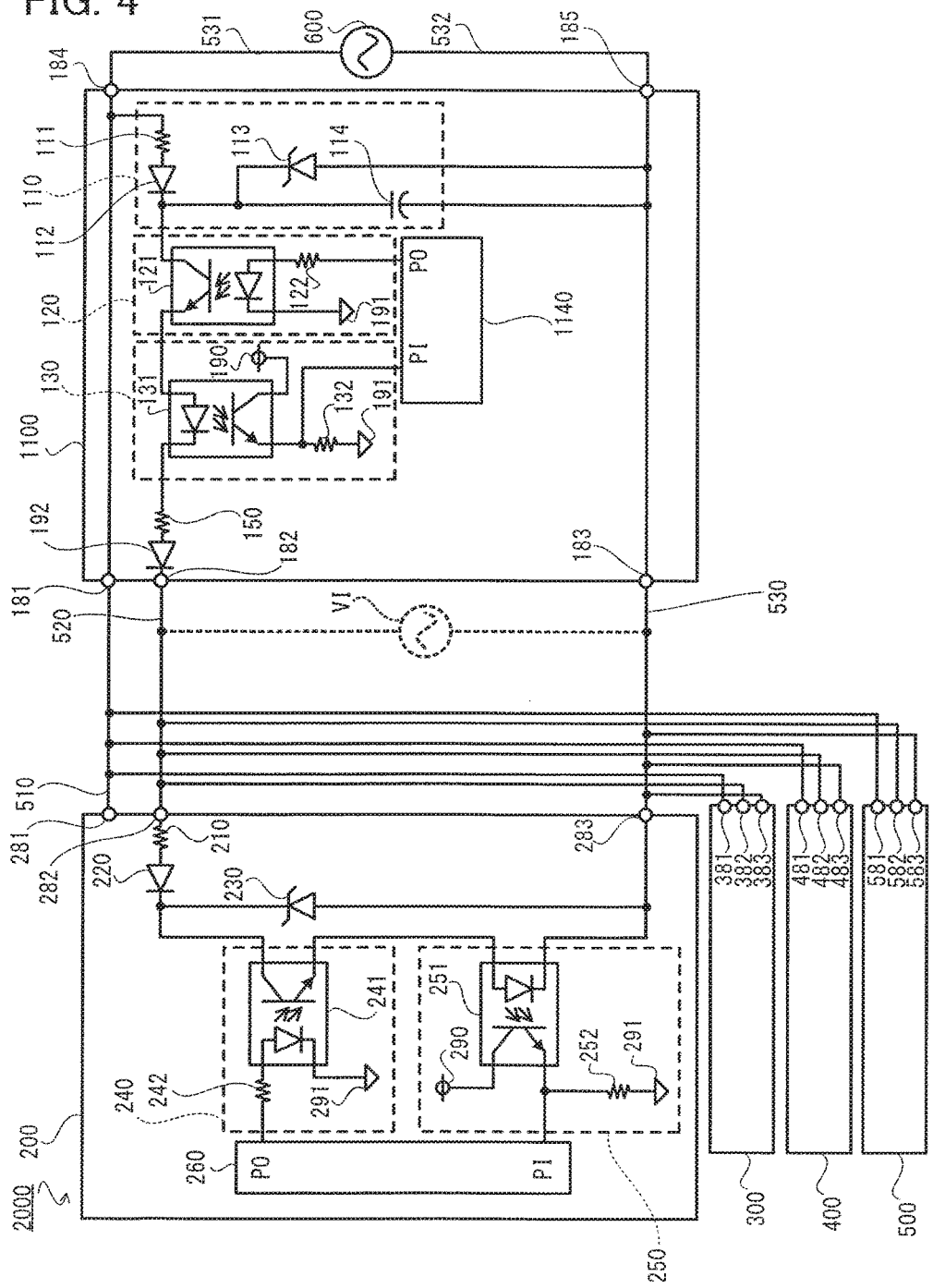
FIG. 4 is a configuration diagram of the communication system according to a comparative example.
Figure 5:
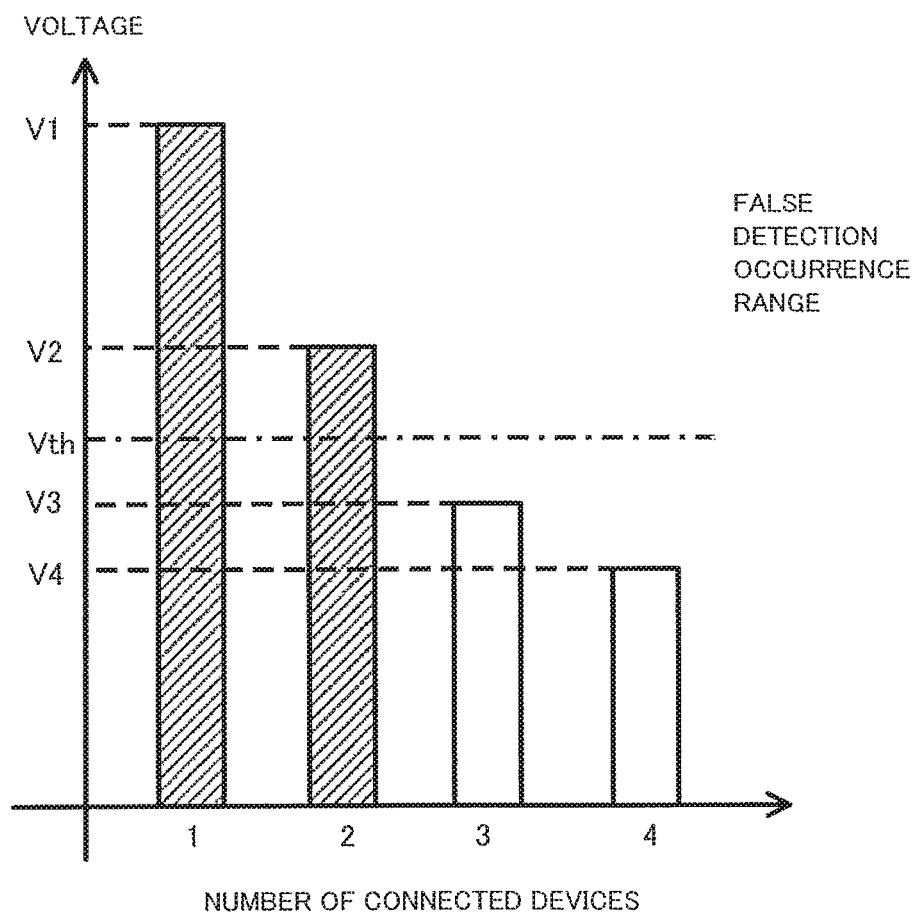
FIG. 5 is a chart showing the voltage between the signal line and the common line in the communication system according to the comparative example.

Moreover, in a communication device 1100 of a communication system 2000 according to a comparative example not comprising the determiner 160 and the switcher 170 as shown in FIG. 4, the line-to-line impedance between the signal line 520 and the common line 530 is increased as the number of connected devices is decreased. For example, assuming that the resistance of the resistor 210 of each of the communication devices 200, 300, 400, and 500 is R, the magnitude of the line-to-line impedance when the number of connected devices is one, two, three, and four are R, R/2, R/3, and R/4, respectively. Then, the voltage between the signal line 520 and the common line 530, which is proportional to the magnitude of the line-to-line impedance as stated above, is increased as the number of connected devices is decreased as shown in FIG. 5.

The magnitude of the noise current flowing through the receiver 250 of the other party of communication of the communication device 1100 when the photocoupler 121 is in the OFF state depends on the inductive voltage VI induced due to the line-to-line capacitance between the power line 510 and the signal line 520. In the case of the communication system 2000 according to the comparative example, depending on the magnitude of the line-to-line capacitance between the power line 510 and the signal line 520, the voltages V1 and V2 between the signal line 520 and the common line 530 when the number of connected devices is one and two (see the hatched parts in FIG. 5) are higher than the lower limit (the threshold voltage) Vth of the voltage range in which false detection occurs at the receiver 250 of the other party of communication.

Figure 6:
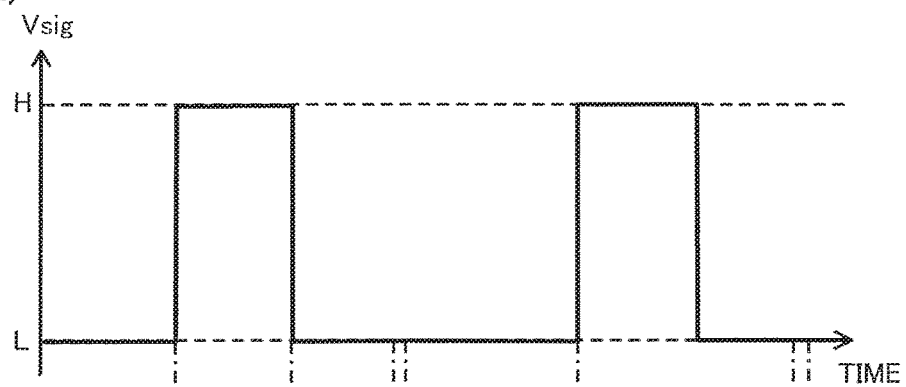
FIG. 6 is a chart showing waveforms of the voltages according to the comparative example, (A) is a chart showing a waveform of the voltage output by the controller to the photocoupler of the transmitter, (B) is a chart showing a waveform of the voltage occurring between the signal line and the common line, and (C) is a chart showing a waveform of the voltage applied to the Parallel Input (PI) terminal of the controller of the other party of communication.
Figure 6:
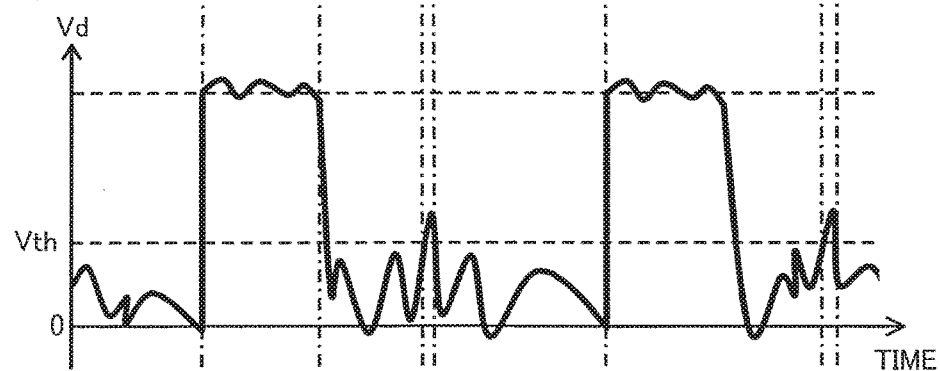
Figure 6:
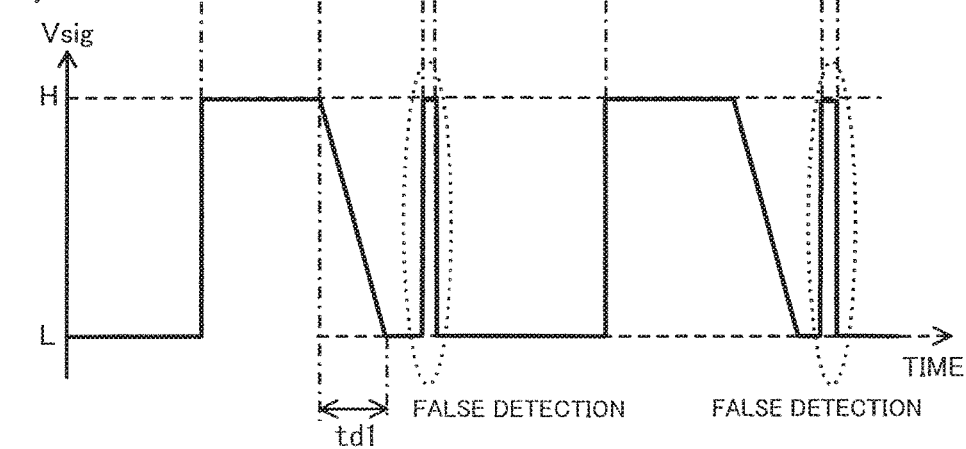

For example, assuming that the controller 140 outputs a voltage having the waveform as shown in FIG. 6(A) to the photocoupler 121 of the transmitter 120, a voltage having the waveform as shown in FIG. 6(B) occurs between the signal line 520 and the common line 530. With the waveform shown in FIG. 6(B), the voltage between the signal line 520 and the common line 530 sometimes exceeds the threshold voltage Vth even though the photocoupler 121 is in the OFF state (the output voltage to the photocoupler 121 is at the level L). In such a case, false detection occurs at the receiver 250 of the other part of communication under the influence of a noise current flowing through the photocoupler 251 of the receiver 250 while the photocoupler 121 is in the OFF state. For example as shown in FIG. 6(C), a voltage of the level H is entered into the PI terminal of the controller 260 from the receiver 250 even though the photocoupler 121 is in the OFF state. Here, as shown in FIG. 5, the voltages V3 and V4 between the signal line 520 and the common line 530 when the number of connected devices is equal to or higher than three (when the number of connected devices is three and four) are lower than the threshold voltage Vth and no false detection occurs at the receiver 250 of the other party of communication.

On the other hand, according to the communication system 1000 according to this embodiment, the communication device 100 connects the resistor 172 between the signal line 520 and the common line 530 based on the number of communication devices connected to the communication device 100. As a result, when data are transmitted from the communication device 100 to the communication device of the other party of communication (for example, 200 or 300), the line-to-line impedance is lowered and the magnitude of the inductive voltage VI is reduced.

Figure 7:
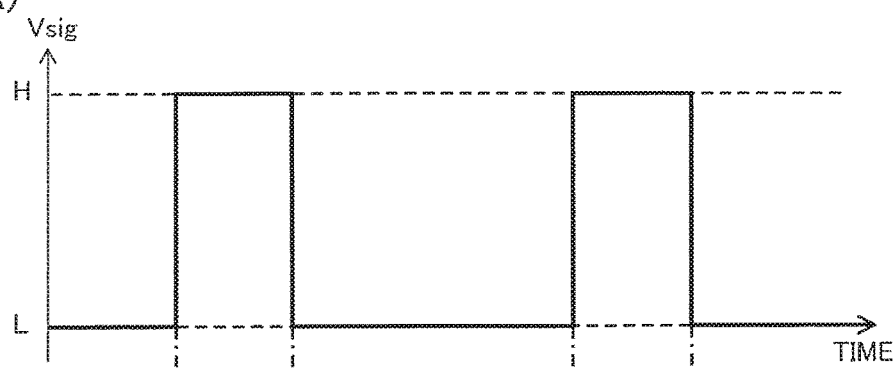
FIG. 7 is a chart showing waveforms of the voltages according to Embodiment 1, (A) is a chart showing a waveform of the voltage output by the controller to the photocoupler of the transmitter, (B) is a chart showing a waveform of the voltage occurring between the signal line and the common line, and (C) is a chart showing a waveform of the voltage applied to the PI terminal of the controller of the other party of communication.
Figure 7:
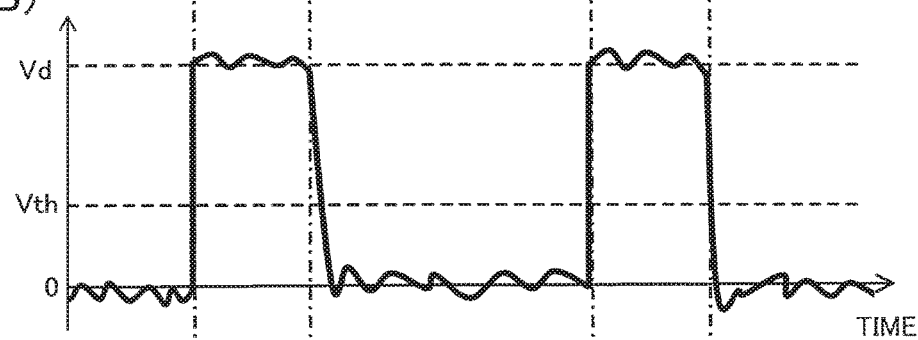
Figure 7:
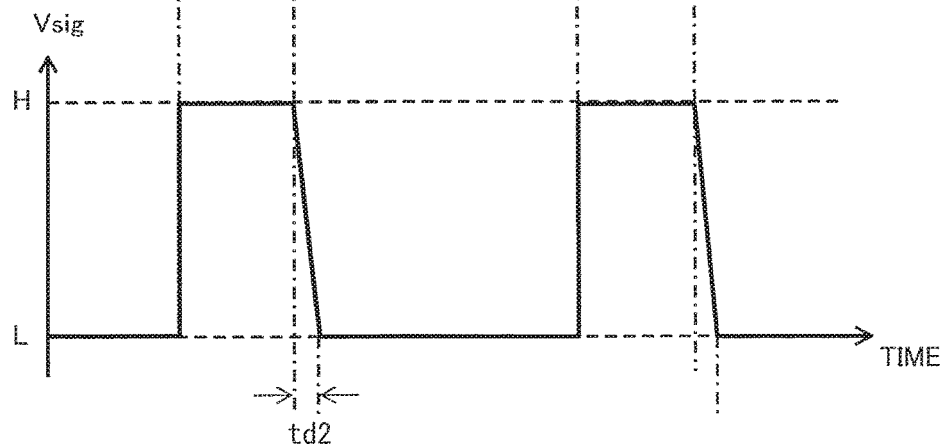

For example, assuming that the controller 140 outputs a voltage having the waveform as shown in FIG. 7(A) to the photocoupler 121 of the transmitter 120, a voltage having the waveform as shown in FIG. 7(B) in which noise components are reduced occurs between the signal line 520 and the common line 530. In such a case, the voltage between the signal line 520 and the common line 530 is kept lower than the threshold voltage Vth while the controller 140 keeps the output voltage to the photocoupler 121 at the level L. In other words, when the photocoupler 121 of the transmitter 120 is in the OFF state, the noise current due to the inductive voltage VI induced between the signal line 520 and the common line 530 is reduced and occurrence of false detection at the receiver 250 of the other party of communication is suppressed. For example as shown in FIG. 7(C), when the photocoupler 121 is in the OFF state, the voltage level entered into the PI terminal of the controller 260 from the receiver 250 shifts at the level L.

In other words, in the communication system 1000 according to this embodiment, the adjuster 180 adjusts the line-to-line impedance between the signal line 520 and the common line 530 by connecting the resistor (the first load resistor) 172 between the signal line 520 and the common line 530 based on the number of communication devices connected to the communication device 100. As a result, it is possible to reduce the noise current due to the inductive voltage VI induced between the signal line 520 and the common line 530 and then suppress false detection of data at the receiver 250 of the other party of communication.

Moreover, in this embodiment, the adjuster 180 switches between the state of the resistor 172 being connected between the signal line 520 and the common line 530 and the state of the resistor 172 not being connected based on the number of connected devices. As a result, energy saving effect can be expected for a wasteful current not flowing through the resistor 172 compared, for example, to the configuration in which the resistor 172 is always connected between the signal line 520 and the common line 530 regardless of the number of connected devices.

Moreover, in this embodiment, for example the installer or the like of the communication system 1000 does not need to manually adjust the line-to-line impedance based on the number of connected devices so as to prevent false detection at the communication device. Thus, the workload of the installer of the communication system 1000 can be reduced.

The discharge time of the line-to-line capacitance CI between the signal line 520 and the common line 530 depends on the product of the capacitance of the line-to-line capacitance CI and the resistance component of the line-to-line impedance. If the capacitance of the line-to-line capacitance CI is constant, the time constant of the discharge time becomes smaller as the resistance component of the line-to-line impedance becomes smaller. On the other hand, in the communication system (1000 according to this embodiment, the controller 140 reduces the magnitude of the resistance component of the line-to-line impedance by means of the switcher 170 when the number of connected devices is one or two. As a result, when the number of connected devices is one or two, the discharge time of the line-to-line capacitance CI can be reduced compared, for example, to the communication system 2000 according to the comparative example. For example as shown in FIG. 6(C) and FIG. 7(C), a delay time td2 when the number of connected devices is one can be reduced compared to a delay time td1 according to the comparative example. Thus, it is possible to reduce the delay time until the receiver 250 of the other party of communication detects the OFF state after the photocoupler 121 of the transmitter 120 of the communication device 100 is put in the OFF state, and thus to speed up data communication.

(Embodiment 2)

Figure 8:
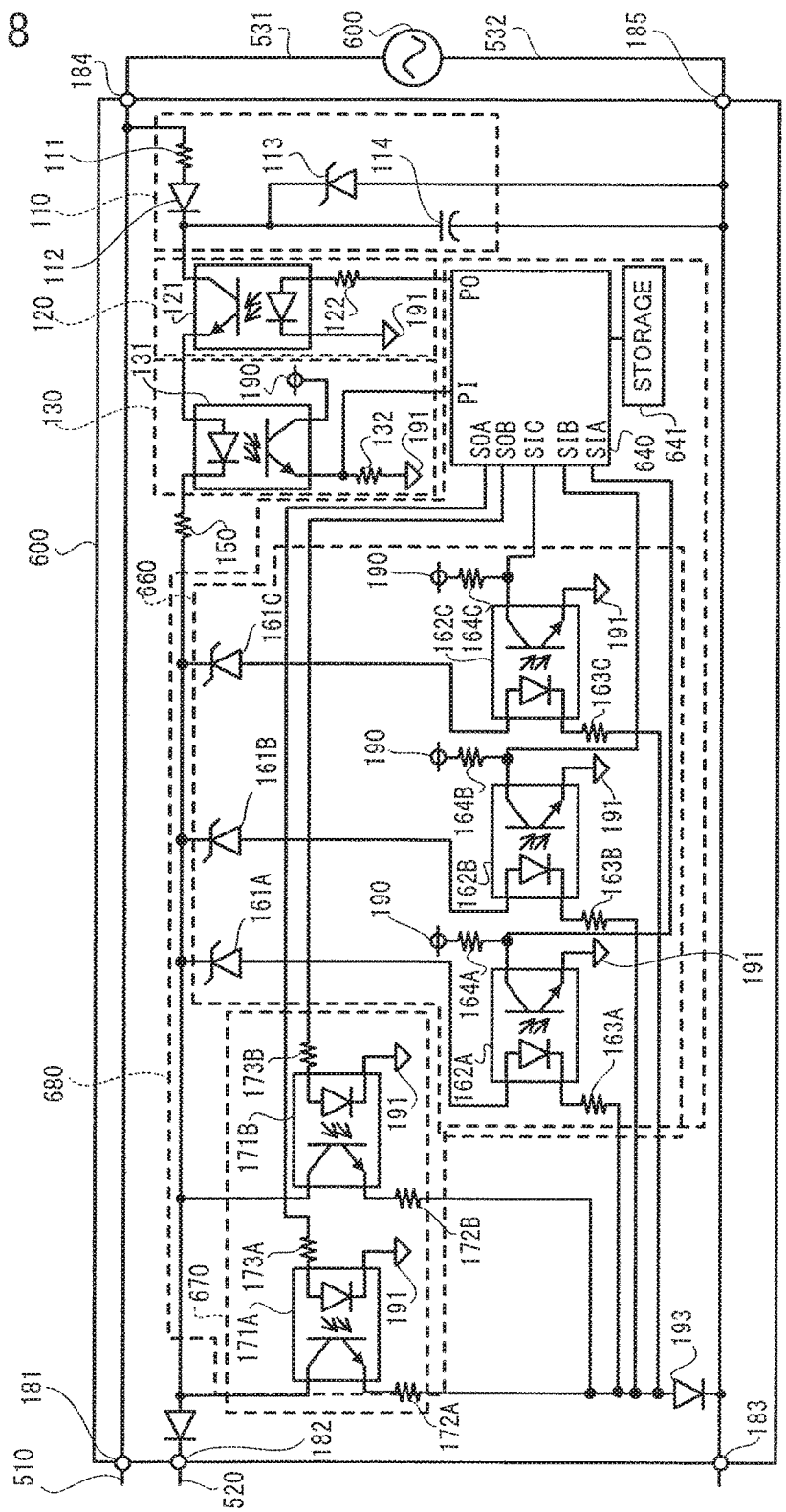
FIG. 8 is a configuration diagram of the communication system according to Embodiment 2.

A communication device 600 according to this embodiment can make the magnitude of the line-to-line impedance constant regardless of the number of communication devices connected to the communication device 600. The communication device 600 is different from the communication device 100 according to Embodiment 1 in, as shown in FIG. 8, the configuration of a determiner 660, the configuration of a switcher 670, and the configuration of a controller 640. Moreover, the communication device 600 comprises a storage 641. The determiner 660, the switcher 670, and the controller 640 constitute an adjuster 680. In FIG. 8, the same components as in Embodiment 1 are given the same reference numbers as in FIG. 1.

The determiner 660 has three Zener diodes 161A. 161B, and 161C, three photocouplers 162A, 162B, and 162C, and six resistors 163A, 163B, 163C, 164A, 164B, and 164C. Here, the connection relationship of the Zener diode 161A, the photocoupler 162A, and the resistors 163A and 164A is the same as the connection relationship of the Zener diode 161, the photocoupler 162, and the resistors 163 and 164 in the determiner 160 described in Embodiment 1. Moreover, the same applies to the connection relationship of the Zener diode 161B, the photocoupler 162B, and the resistors 163B and 164B and the connection relationship of the Zener diode 161C, the photocoupler 162C, and the resistors 163C and 164C. The three photocouplers 162A, 162B, and 162C are connected to a terminal SIA, a terminal SIB, and a terminal SIC of the controller 640, respectively.

Assuming that the respective Zener voltages of the Zener diodes 161A, 161B, and 161C are VzA, VzB, and VzC, the relationship VzA>VzB>VzC is satisfied. Moreover, in the comparative example shown in FIG. 4, it is assumed that the voltage between the signal line 520 and the common line 530 when the number of communication devices connected to the communication device 1100 is one, two, three, and four is V1, V2, V3, and V4 (V1>V2>V3>V4), respectively (see FIG. 5). In such a case, the respective Zener voltages of the Zener diodes 161A, 161B, and 161C satisfy the relationships V1>VzA>V2, V2>VzB>V3, and V3>VzC>V4.

The switcher 670 comprises two photocouplers 171A and 171B and four resistors 172A, 172B, 173A and 173B. Here, the relationship of the photocoupler 171A and the resistors 172A and 173A is the same as the relationship of the photocoupler 171 and the resistors 172 and 173 in the switcher 170 described in Embodiment 1. Moreover, the same applies to the relationship of the photocoupler 171B and the resistors 172B and 173B. The two photocouplers 171A and 171B are connected to a serial output A (SOA) terminal and a serial output B (SOB) terminal of the controller 640, respectively. Here, the resistance of the resistor 172A is set to a magnitude of ½ of the resistance of the resistor 172B.

The controller 640 switches to pass/cutoff the currents through the resistor 172A or the resistor 172B by controlling the photocouplers 171A and 171B of the switcher 670 separately. Moreover, the controller 640 determines the number of communication devices connected to the communication device 600 based on the respective states of the photocouplers 162A. 162B, and 162C of the determiner 660. The controller 640 comprises a PO terminal, an SOA terminal, and an SOB terminal outputting a voltage of the level H or the level L and a PI terminal, a serial input A (SIA) terminal, a serial input B (SIB) terminal, and a serial input C (SIC) terminal into which a voltage of the level H or the level L is entered. The controller 640 switches the voltage level of the SOA terminal and the SOB terminal separately between the level H and the level L based on the connection/disconnection of the resistor 172A or the resistor 172B. Furthermore, the controller 640 distinguishes and determines at which level the voltage applied to each of the SIA terminal, the SIB terminal, and the SIC terminal is, the level H or the level L.

The storage 641 is configured by a nonvolatile readable/writable semiconductor memory, for example by a flash memory or the like, and stores a control table for controlling the photocouplers 171A and 171B. The storage 641 is configured, for example, by a nonvolatile memory or the like. The control table is, for example as shown in FIG. 9, one presenting the correspondence between the voltage level entered into each of the SIA terminal, the SIB terminal, and the SIC terminal and the voltage level to output from each of the SOA terminal and the SOB terminal.

Operation of the communication system according to this embodiment will be described next. Here, the explanation will be made on the assumption that the resistance of the resistor 210 of each of the communication devices 200, 300, 400, and 500 is R, the resistance of the resistor 172A is R/2, and the resistance of the resistor 172B is R.

Figure 10A:
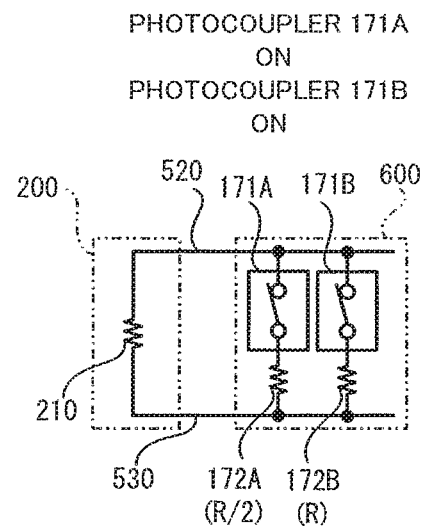
FIG. 10A is an equivalent circuit of the communication system according to Embodiment 2 when the number of connected devices is one.

When the number of connected devices is one, the voltage levels of the SIA terminal, the SIB terminal, and the SIC terminal are all the level L. In such a case, the controller 640 sets the voltage levels of both the SOA terminal and the SOB terminal to the level H with reference to the control table shown in FIG. 9. As a result, as shown in FIG. 10A, both the photocouplers 171A and 171B are put in the ON state and both the resistors 172A and 172B are connected between the signal line 520 and the common line 530. Then, the magnitude of the line-to-line impedance is 1/(1/R+1/R+1/(R/2))=R/4.

Figure 10B:
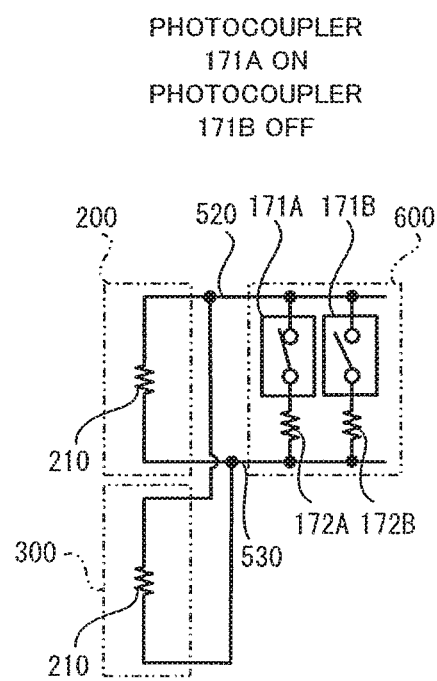
FIG. 10B is an equivalent circuit of the communication system according to Embodiment 2 when the number of connected devices is two.

When the number of connected devices is two, the voltage level of the SIA terminal is the level H and the voltage levels of the SIB terminal and the SIC terminal are the level L. In such a case, the controller 640 sets the voltage level of the SOA terminal to the level H and sets the voltage level of the SOB terminal to the level L with reference to the control table shown in FIG. 9. As a result, as shown in FIG. 10B, the photocoupler 171A is put in the ON state and the photocoupler 171B is put in the OFF state and only the resistor 172A is connected between the signal line 520 and the common line 530. Then, the magnitude of the line-to-line impedance is 1/(1/R+1/R+1/(R/2))=R/4.

Figure 10C:
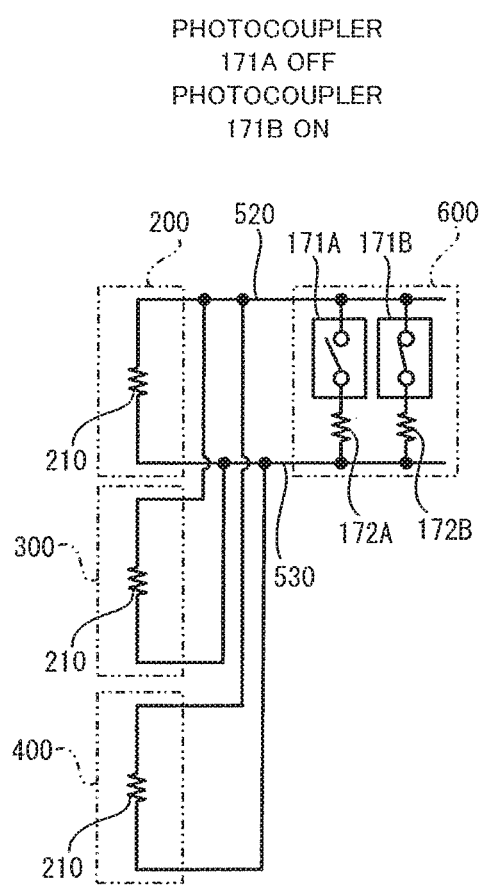
FIG. 10C is an equivalent circuit of the communication system according to Embodiment 2 when the number of connected devices is three.

When the number of connected devices is three, the voltage levels of the SIA terminal and the SIB terminal are the level H and the voltage level of the SIC terminal is the level L. In such a case, the controller 640 sets the voltage level of the SOA terminal to the level L and sets the voltage level of the SOB terminal to the level H with reference to the control table shown in FIG. 9. As a result, as shown in FIG. 10C, the photocoupler 171A is put in the OFF state and the photocoupler 171B is put in the ON state and only the resistor 172B is connected between the signal line 520 and the common line 530. Then, the magnitude of the line-to-line impedance is 1/(1/R+1/R+1/R)=R/4.

Figure 10D:
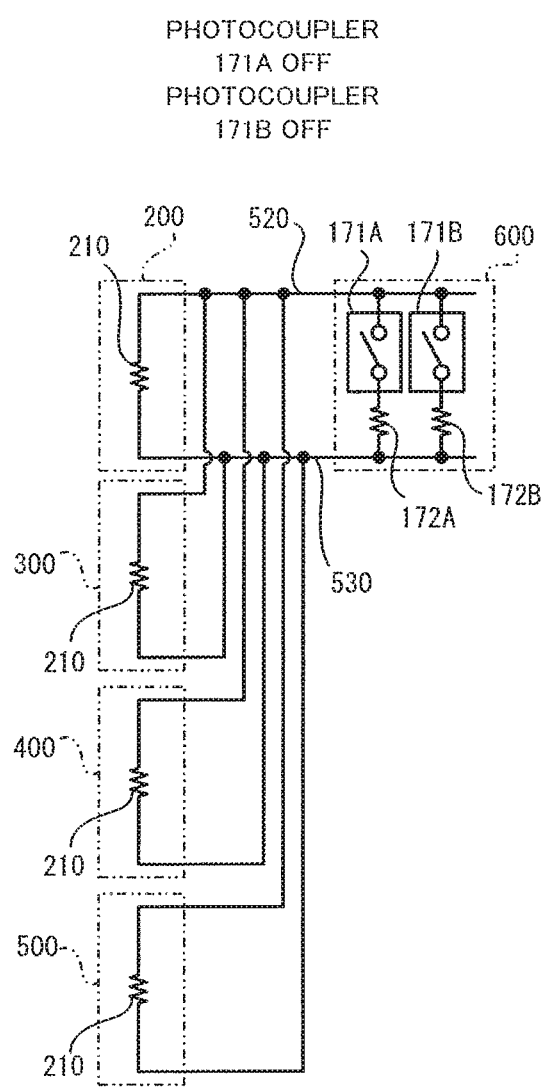
FIG. 10D is an equivalent circuit of the communication system according to Embodiment 2 when the number of connected devices is four.

When the number of connected devices is four, the voltage levels of the SIA terminal, the SIB terminal, and the SIC terminal are all set at the level H. In such a case, the controller 640 sets the voltage levels of both the SOA terminal and the SOB terminal to the level L with reference to the control table shown in FIG. 9. As a result, as shown in FIG. 10D, both the photocouplers 171A and 171B are put in the OFF state and neither the resistor 172A nor 172B is connected between the signal line 520 and the common line 530. Then, the magnitude of the line-to-line impedance is 1/(1/R+1/R+1/R+1/R) R/4.

As described above, in the communication system according to this embodiment, the communication device 600 switches the connection states of the resistor (the first load resistor) 172A and the resistor (the second load resistor) 172B between the signal line 520 and the common line 530 based on the number of communication devices connected to the communication device 600. As a result, when the number of communication devices connected to the communication device 600 is equal to or less than a preset number of devices (for example, four devices), the magnitude of the line-to-line impedance can be made nearly constant of R/4 regardless of the number of connected devices. Thus, it is possible to facilitate designing of the receiver 250 of each of the communication devices 200, 300, 400, and 500 connected to the communication device 600. However, in practice, the resistance of the resistors 172A, 172B, and 210 vary due to manufacturing errors and the like. The above-stated "nearly constant" means falling within a preset range regardless of varied resistance of the resistors 172A, 172B, and 210.

(Embodiment 3)

Figure 11:
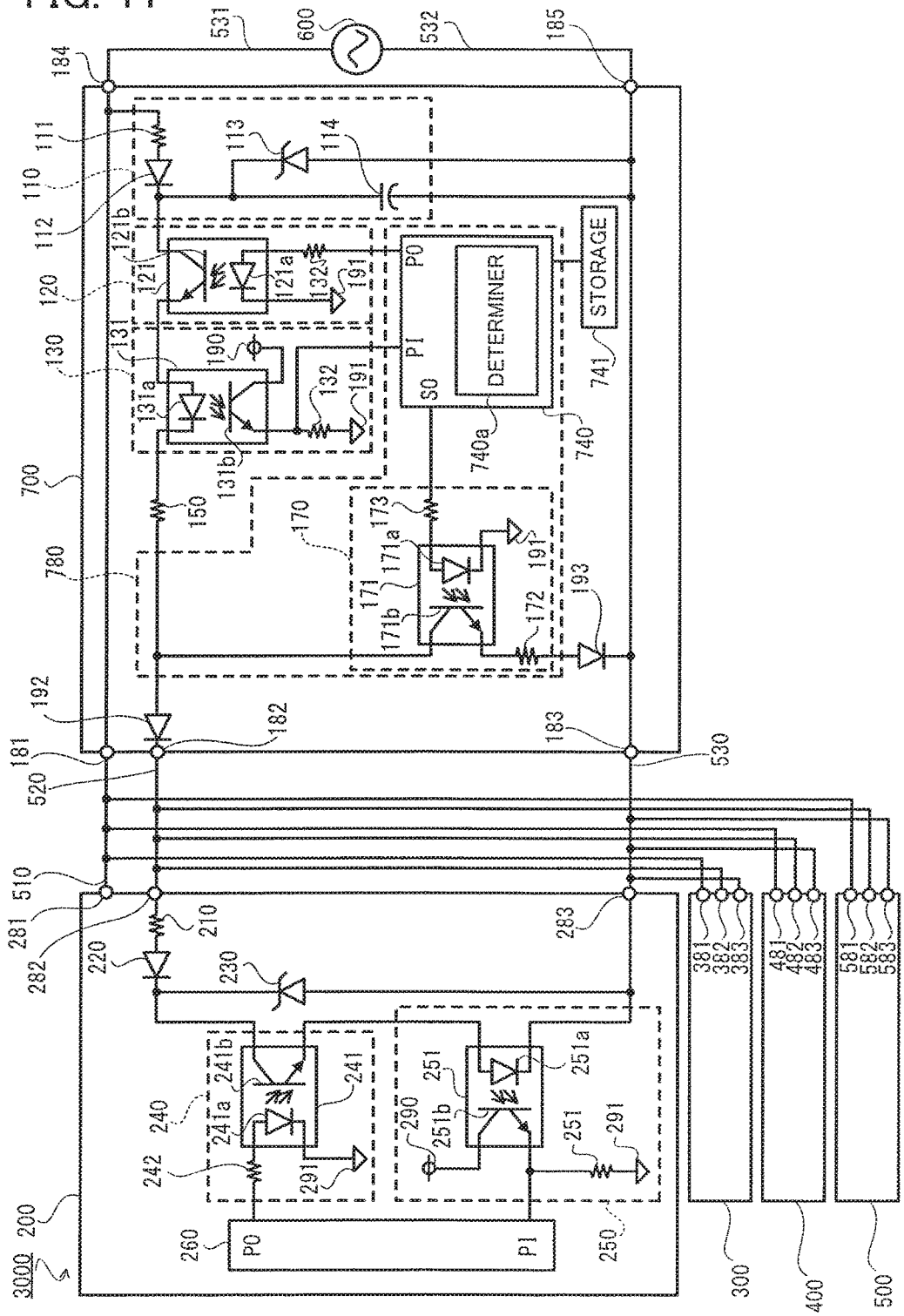
FIG. 11 is a configuration diagram of the communication system according to Embodiment 3.

In the communication system according to this embodiment, one communication device transmits a response request signal to the other communication devices connected to the one communication device and detects the number of other communication devices connected to the one communication device based on a received response signal. As shown in FIG. 11, a communication device system 3000 according to this embodiment is different from Embodiments 1 and 2 in that the determiner 160 is not provided. A communication device 700 broadcasts a response request signal to the communication devices connected to the communication device 700 and determines the number of communication devices connected to the communication device 700 based on a response signal in response to the response request signal. Moreover, in the communication system 3000, the communication devices 700, 200, 300, 400, and 500 adopt a low speed communication mode for transmission and reception of a response request signal and a response signal in which the communication speed is lower and the noise resistance is higher than in a high speed communication mode for transmission and reception of data other than the response request signal and the response signal at a high speed. In FIG. 11, the same components as in Embodiment 1 are given the same reference numbers as in FIG. 1.

A storage 741 is configured by a nonvolatile readable/writable semiconductor memory, for example by a flash memory or the like, and stores programs for a controller 740 to execute the data transmission procedure.

The controller 740 comprises a determiner 740a reading a program stored in the storage 741 and executing the data transmission procedure to determine the number of communication devices connected to the communication device 700. The determiner 740a broadcasts a response request signal to the communication devices connected to the communication device 700 by controlling the photocoupler 121. Moreover, the determiner 740a receives a response signal to the response request signal based on the state of the photocoupler 131. Then, the determiner 740a determines the number of communication devices connected to the communication device 700 based on the received response signal. Moreover, the controller 740 switches to pass/cutoff the currents through the resistor 172 by controlling the photocoupler 171 of the switcher 170 based on the determined number of connected devices. The controller 740 comprises a PO terminal and an SO terminal outputting a voltage of the level H or the level L and a PI terminal into which a voltage of the level H or the level L is entered.

Receiving a response request signal from the communication device 700, the controller 260 of each of the communication device 200, the communication device 300, the communication device 400, and the communication device 500 transmits a response signal to the communication device 700.

Figure 12:
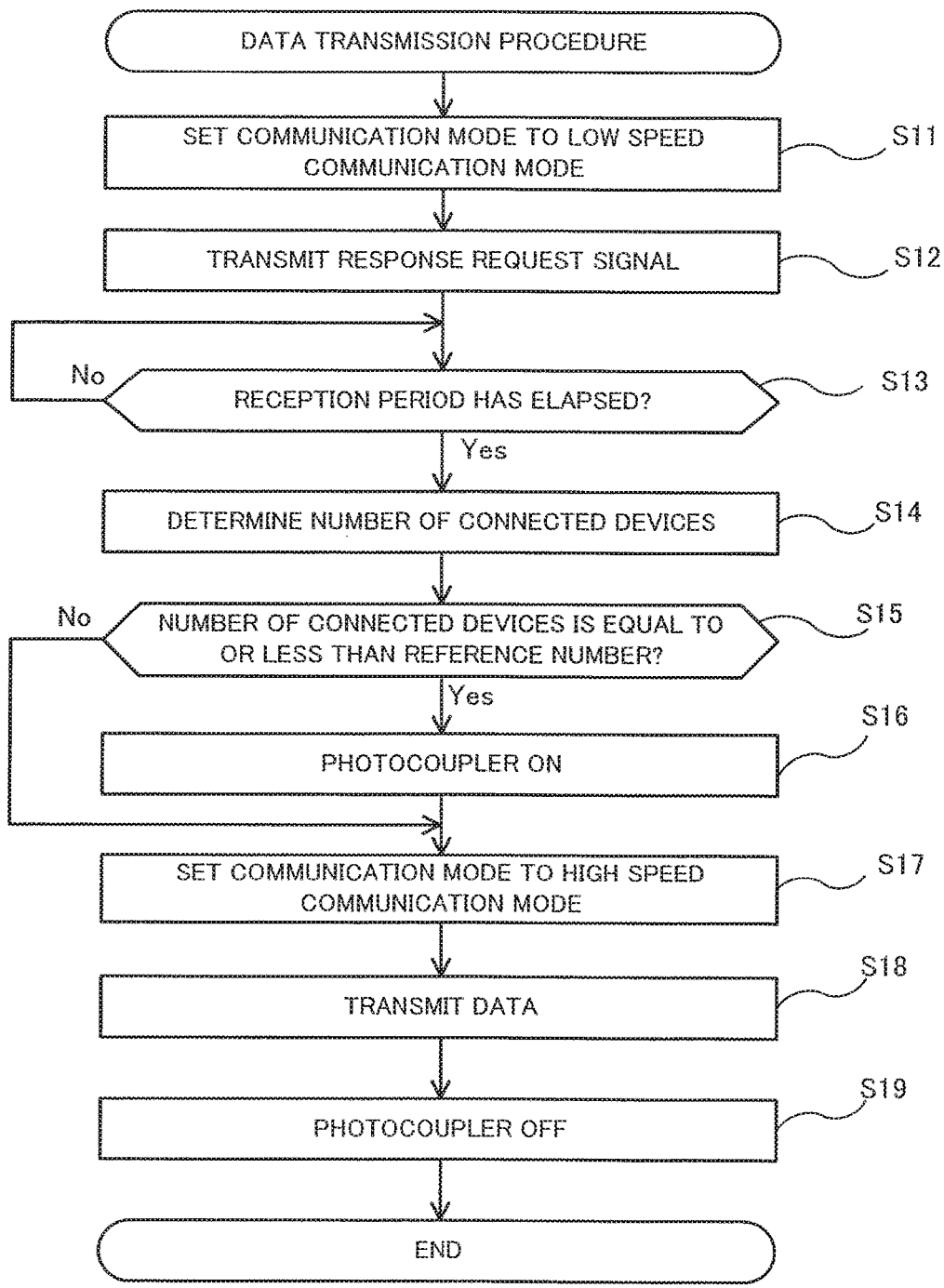
FIG. 12 is a flowchart showing the data transmission procedure executed by the controller of the communication device according to Embodiment 3.
Figure 13:
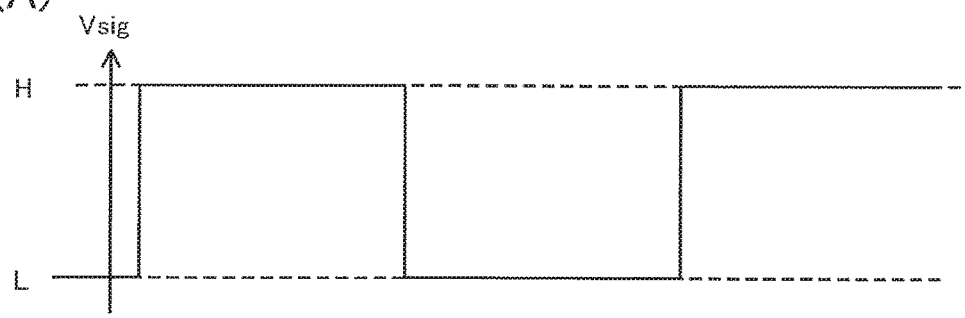
FIG. 13 is a chart showing waveforms of the voltage in the low speed communication mode according to Embodiment 3, (A) is a chart showing a waveform of the voltage output by the controller to the photocoupler of the transmitter, (B) is a chart showing a waveform of the voltage occurring between the signal line and the common line, and (C) is a chart showing a waveform of the voltage applied to the PI terminal of the controller of the other party of communication.
Figure 13:
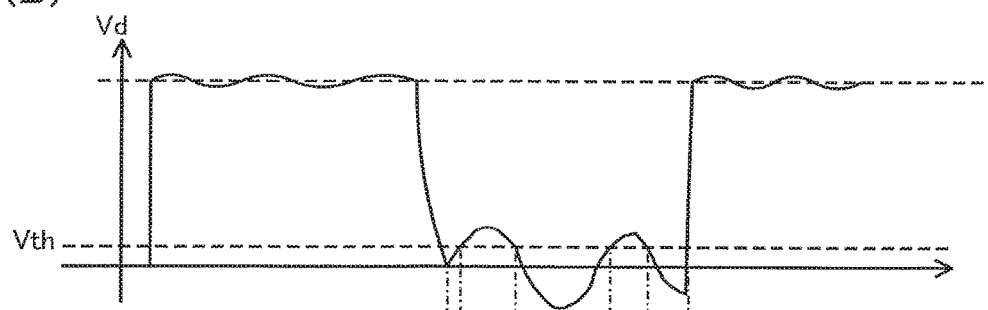
Figure 13:
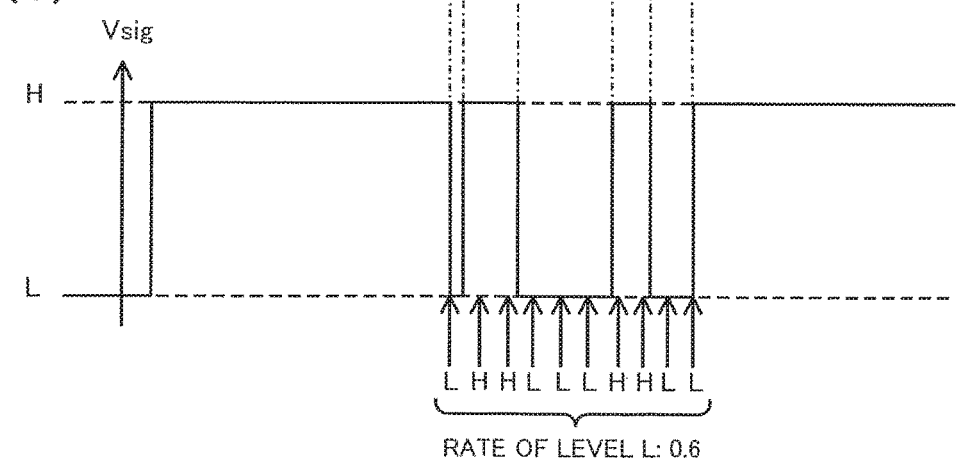

The data transmission procedure executed by the controller 740 of the communication device 700 according to this embodiment will be described next with reference to FIGS. 12 to 14. Triggered, for example, by the communication device 700 being powered on by the user, the data transmission procedure starts.

First, the controller 740 sets a low speed communication mode in which the communication speed is lower and the noise resistance is higher than in a high speed communication mode for transmitting data other than the response request signal (Step S11). The controller 740 first functions as the determiner 740a to set the communication mode to a low communication speed mode in which the communication is established even if a certain degree of false detection occurs at the receiver 250 of the other party of communication. In the low speed communication mode, the voltage level of each bit of data is judged based on the ratio of the level H or the level L to the total number of samplings on one bit of data. In the low speed communication mode, the data accuracy is improved as the total number of samplings per bit of data is higher. The controller 740 increases the number of times of sampling per bit of data by, for example, slowing down the communication speed while keeping the sampling cycle. Here, "the level H" and "the level L" correspond to two bit levels presenting one bit of data.

In the communication device 700, it is assumed that the controller 740 outputs a voltage having the waveform as shown in FIG. 13(A) to the photocoupler 121 of the transmitter 120. Here, it is assumed that the period of the photocoupler 121 being in the OFF state corresponds to one bit of data transmitted by the communication device 700. In such a case, as shown in FIG. 13(B), the waveform of the voltage between the signal line 520 and the common line 530 changes under the influence of a noise current occurring due to the inductive voltage VI induced between the signal line 520 and the common line 530 in the period of the photocoupler 121 being in the OFF state. Here, a voltage Vth in FIG. 13(B) presents the lower limit (the voltage threshold) of the voltage the controller 250 of the other party of communication of the communication device 700 falsely detecting the level H. Then, the controller 260 of the other party of communication of the communication device 700 judges that the voltage signal entered into the PI terminal from the receiver 250 is at the level H each time it exceeds the voltage threshold as shown in FIG. 13(C). In the case shown in FIG. 13(C), although the communication device 700 tries to transmit one bit of data at the level L, the controller 260 detects the level H four times per bit of data.

On the other hand, in the low speed communication mode according to this embodiment, the level L is assumed if the rate of the level L in sampling per bit of data is equal to or higher than a half (0.5), and the level H is assumed if the rate of the level L is lower than a half (0.5). Thus, in the example shown in FIG. 13(C), the rate of the level L per bit of data is 0.6 and therefore, whereby the controller 260 judges that this one bit is at the level L. In the high speed communication mode during data transmission, for example the voltage level of each bit of data is judged in one sampling. On the other hand, in the low speed communication mode, the voltage level of each bit of data is judged based on the rate of the voltage level per bit of data, whereby the noise resistance is higher compared to the high speed communication mode.

Returning to FIG. 12, after executing the processing of Step S11, the controller 740 transmits a response request signal in the low speed communication mode (Step S12). The response request signal comprises a communication packet including, for example, transmission source identification information for identifying the transmission source and type identification information for identifying the signal type as the response request signal. The controller 740 broadcasts the response request signal without specifying the transmission destination of the response request signal.

Next, the controller 740 judges whether a reception period for receiving a response signal from each of the communication devices connected to the communication device 700 has elapsed (Step S13). The controller 740 remains in the stand-by state unless the reception period has elapsed (Step S13: No). The controller 740 judges that the communication devices having transmitted a reception signal received within the reception period are connected to the communication device 700.

Figure 14:
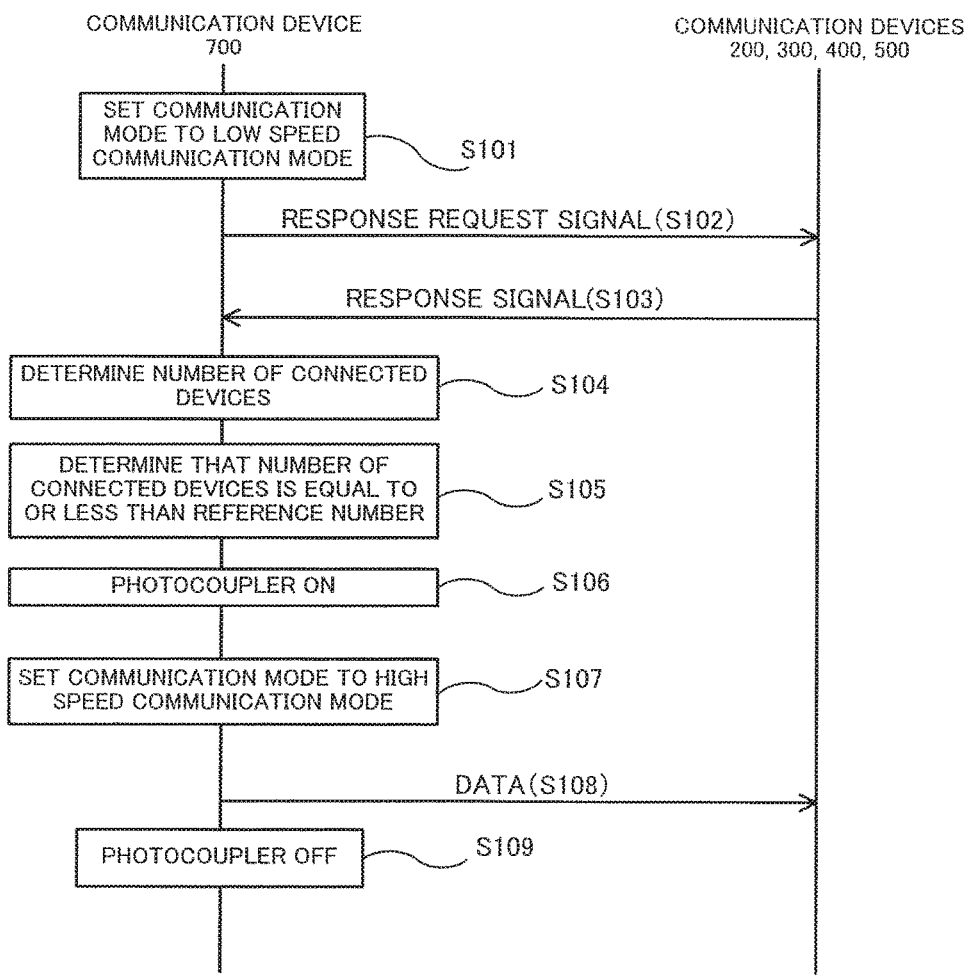
FIG. 14 is a sequence chart showing operation of the communication system according to Embodiment 3.

As shown in FIG. 14, it is assumed that after the communication device 700 sets the communication mode to the low speed communication mode (Step S101), a response request signal is transmitted by the communication device 700 to the communication devices 200, 300, 400, and 500 in the low speed communication mode (Step S102). Then, a response signal corresponding to the response request signal is transmitted by each of the communication devices 200, 300, 400, and 500 to the communication device 700 in the low speed communication mode (Step S103). Each receiving a response request signal, the communication devices 200, 300, 400, and 500 transmit a response signal to the transmission destination of the response signal determined based on the transmission source identification information included in the received response request signal. The response signal comprises a communication packet including, for example, transmission source identification information for identifying the transmission source, transmission destination identification information for identifying the transmission destination, and type identification information for identifying that the type of the signal is a response signal.

Returning to FIG. 12, if the reception period has elapsed in Step S13 (Step S13: Yes), the controller 740 determines the number of communication devices connected to the communication device 700 based on the number of transmission sources of the received response signal (Step S14).

Subsequently, the controller 740 judges whether the determined number of connected devices is equal to or less than a reference number of devices (Step S15). In this embodiment, since the reference number of devices is set to two, the controller 740 judges whether the determined number of connected devices is equal to or less than two.

If judged that the number of connected devices is higher than the reference number of devices in Step S15 (Step S15: No), the processing of Step S17 described later will be executed directly. On the other hand, if judged that the number of connected devices is equal to or less than the reference number of devices in Step S15 (Step S15: Yes), the controller 740 puts the photocoupler 171 in the ON state (Step S16) and then sets the communication mode to the high speed communication mode (Step S17). Specifically, the controller 740 increases the communication speed by, for example, reducing the number of times of sampling per bit of data while keeping the sampling cycle and judges the voltage level of each bit of data in one sampling.

Subsequently, the controller 740 transmits data in the high speed communication mode (Step S18).

Next, after completing data transmission (Step S18), the controller 740 puts the photocoupler 171 in the OFF state again (Step S19).

For example as shown in FIG. 14, in the communication device 700, after determining the number of connected devices (Step S104) and judging that the number of connected devices is equal to or less than a reference number of devices (Step S105), the controller 740 puts the photocoupler 171 in the ON state (Step S106) and sets the communication mode to the high speed communication mode (Step S107). Then, data are transmitted by the communication device 700 to the communication devices 200, 300, 400, and 500 connected to the communication device 700 in the high speed communication mode (Step S108). After finishing data transmission, the controller 740 puts the photocoupler 171 in the OFF state (Step S109).

As described above, in the communication system 3000 according to this embodiment, the controller 740 of the communication device 700 comprises the determiner. As a result, the circuit configuration of the communication device 700 can be simplified. Moreover, the communication device 700 can relatively easily change the reference number of devices by changing the content of the data transmission procedure program stored in the storage 741. Thus, it is advantageously easy to handle the case in which, for example, the line-to-line capacitance between the power line 510 and the signal line 520 is subject to change due to change in the installation situation of the communication device 700 or the like and the reference number of devices has to be changed.

Moreover, in the communication system 3000 according to this embodiment, the controller 740 of the communication device 700 sets the communication mode to the low speed communication mode or to the high speed communication mode without changing the sampling cycle. As a result, it is possible to prevent the processing load of the controller 740 from being increased in association with a shortened sampling cycle.

(Embodiment 4)

In the communication system according to this embodiment, the communication device adopts, also for transmission and reception of the response request signal and the response signal, the high speed communication mode adopted for transmission and reception of data other than the response request signal and the response signal. The communication system according to this embodiment comprises the same configuration as the communication system 3000 according to Embodiment 3. In the following explanation, the same components as in Embodiment 3 are referred to by the same reference numbers. In this embodiment, the data transmission procedure executed by the controller 740 is different in content from the data transmission procedure according to Embodiment 3.

Figure 15:
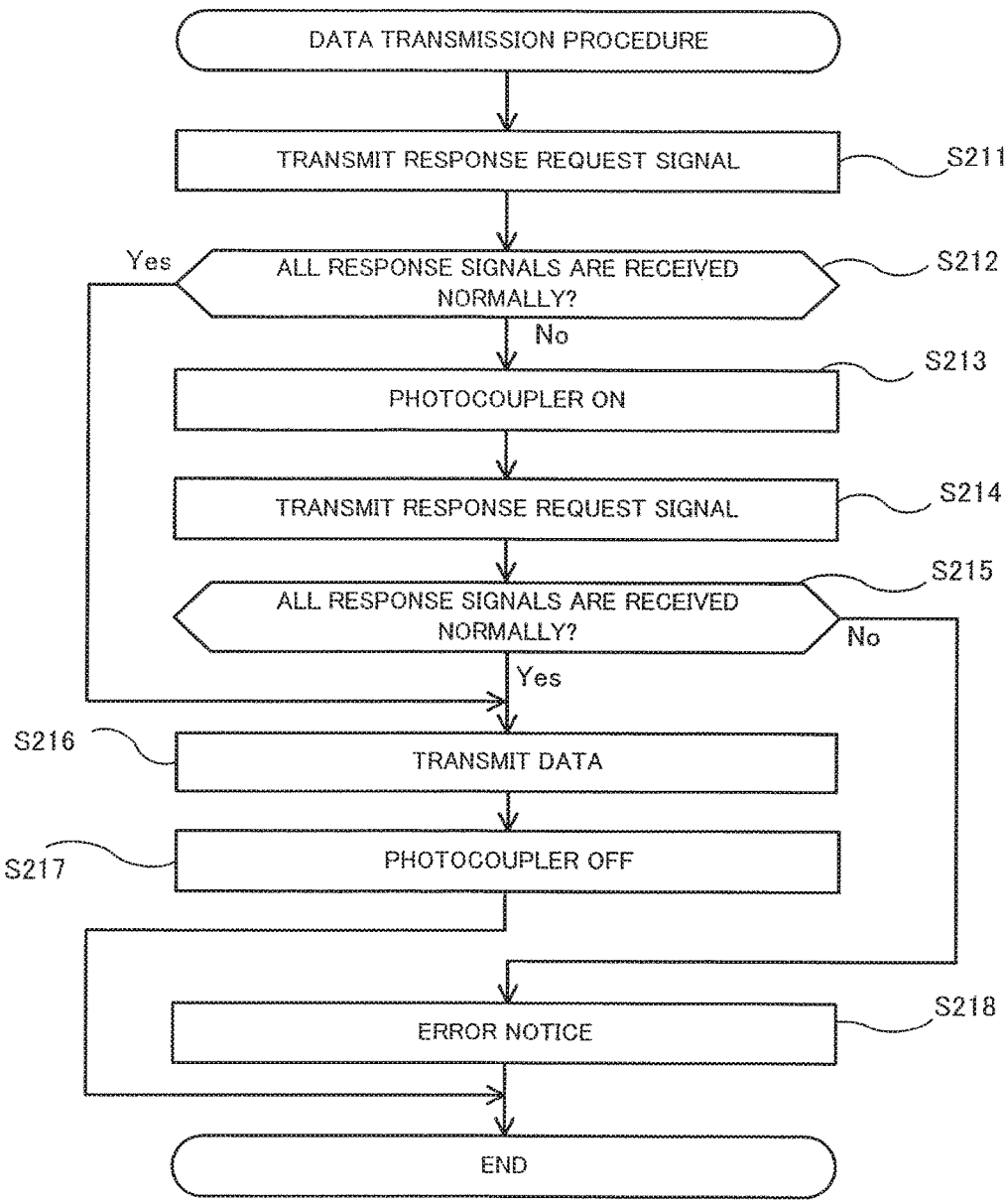
FIG. 15 is a flowchart showing the data transmission procedure executed by the controller of the communication device according to Embodiment 4.

The data transmission procedure executed by the controller 740 of the communication device 700 according to this embodiment will be described with reference to FIG. 15. In FIG. 15, the processing of Steps S213, S216, and S217 is the same processing as the processing of Steps S16, S18, and S19 in FIG. 12 of Embodiment 3.

First, the controller 740 transmits a response request signal in the high speed communication mode adopted for transmitting data (Step S211). The controller 740 broadcasts a response request signal without specifying the destination of the response request signal. The controller 740 transmits the response request signal one time or multiple times.

Receiving the response request signal, the communication devices 200, 300, 400, and 500 connected to the communication device 700 transmit a response signal corresponding thereto. Here, the response request signal includes an error detection code (for example, a cyclic redundancy check (CRC) value, parity check data, and the like) for the controller 740 to detect an error along with the above-described transmission source identification information, transmission destination identification information, and type identification information.

Next, the controller 740 judges whether all response signals from the communication devices connected to the communication device 700 are received normally (Step S212). Here, the controller 740 judges whether all response signals are received normally by executing an error detection procedure on the response signal to the response request signal transmitted one time or multiple times. The controller 740 judges that all response signals are received normally when no code error is detected on all response signals.

If judged that all response signals are received normally in Step S212 (Step S212: Yes), the processing of Step S216 is executed directly. On the other hand, if judged that some response signals are not received normally in Step S212 (Step S212: No), the controller 740 puts the photocoupler 171 in the ON state (Step S213) and then transmits a response request signal in the high speed communication mode again (Step S214).

Subsequently, the controller 740 judges again whether all response signals are received normally from the communication devices connected to the communication device 700 (Step S215). If judged that all response signals are received normally in Step S215 (Step S215: Yes), the processing of Step S216 is executed directly. On the other hand, if judged that some response signals are not received normally in Step S215 (Step S215: No), the controller 740 gives notice of an error via a user interface (not shown) provided to the communication device 700 (Step S218). In such a case, the reason that the communication device 700 fails to receive the response signal normally is something other than the influence of a noise current due to the inductive voltage VI induced between the signal line 520 and the common line 530.

As described above, in the communication system according to this embodiment, the communication device 700 can eliminate the procedure to determine the number of connected devices based on the response signal received from the communication devices connected to the communication device 700 and the procedure to change the communication mode. As a result, the processing load of the controller 740 of the communication device 700 can advantageously be reduced.

(Embodiment 5)

Figure 16:
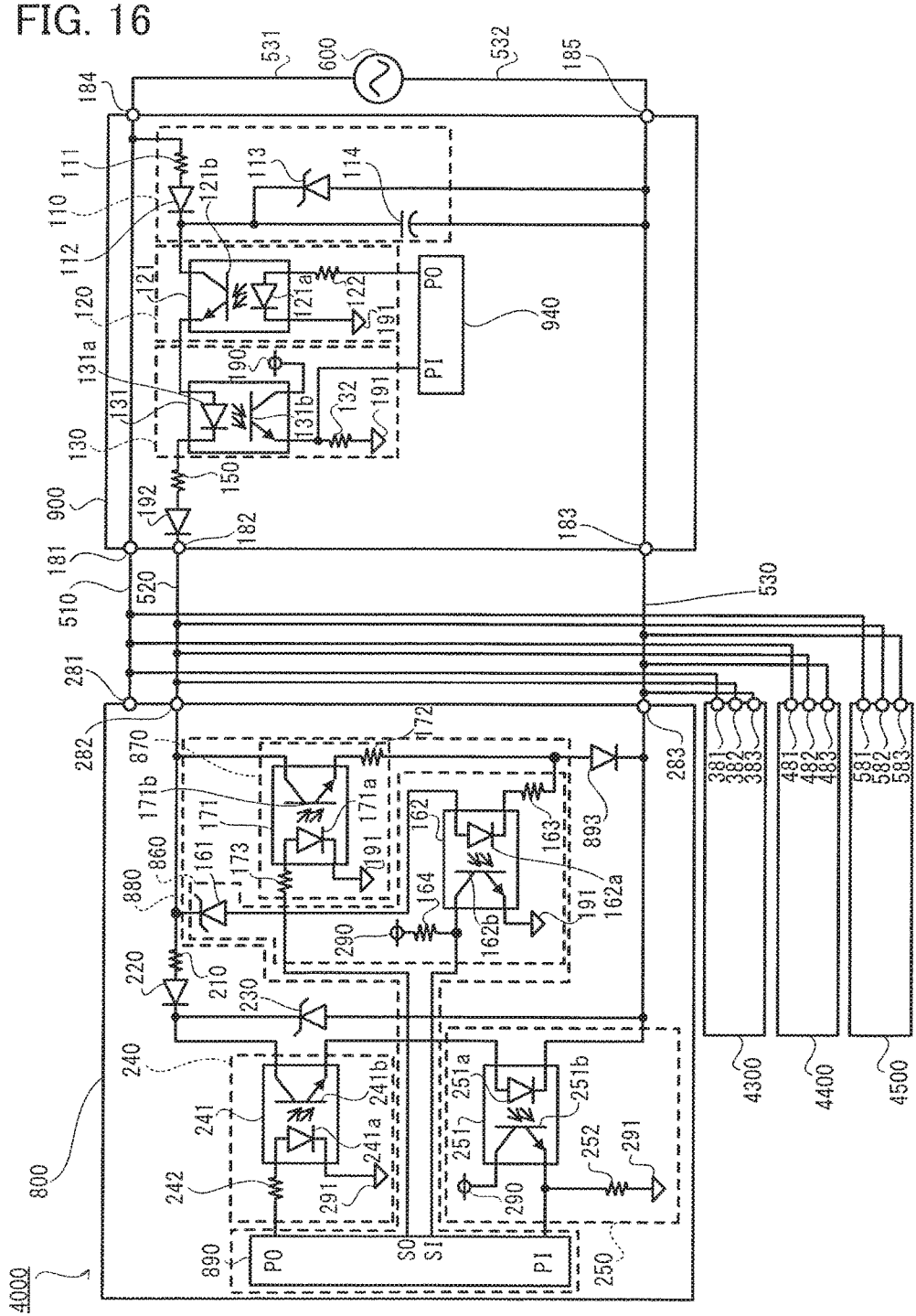
FIG. 16 is a configuration diagram of the communication system according to Embodiment 5.

The communication system according to this embodiment adjusts the line-to-line impedance in a communication device comprising no direct current power supply. As shown in FIG. 16, a communication system 4000 according to this embodiment is different from Embodiment 1 in that an adjuster 880 is provided not to a communication device 900 supplying a communication current but to a communication device 800 supplied with a communication current from the communication device 900. In FIG. 16, the same components as in Embodiment 1 are given the same reference numbers as in FIG. 1.

The communication device 900 comprises the direct current power supply 110, the transmitter 120, the receiver 130, a controller 940, the resistor 150, and the diode 192. The controller 940 transmits data by controlling the photocoupler 121. Moreover, the controller 940 has the same configuration as the controller 260 described in Embodiment 1.

The communication device 800 comprises the transmitter 240, the receiver 250, a determiner 860, a switcher 870, a controller 890, the resistor 210, the diode 220, a diode 893, and the Zener diode 230. The determiner 860, the switcher 870, and the controller 890 constitute the adjuster 880 adjusting the line-to-line impedance between the signal line 520 and the common line 530 according to the number of communication devices (for example, 800, 300, 400, and 500) connected to the communication device 900. Here, communication devices 4300, 4400, and 4500 have the same configuration as the communication device 800.

The diode 893 cuts off a reverse current that may flow through the transfer path due to wrong wiring or the like. As a result, the diode 893 plays the role of protecting the circuit elements constituting the transmitter 240, the receiver 250, the determiner 860, and the switcher 870. The cathode of the diode 893 is connected to the terminal 283.

The determiner 860 has the same configuration as the determiner 160 described in Embodiment 1 and comprises the Zener diode 161, the photocoupler 162, the resistor 163, and the resistor 164. The controller 890 determines the number of connected devices by means of the determiner 860. In the determiner 860, the anode of the Zener diode 161 is connected to the resistor 210. Moreover, the resistor 163 connected at one end to the cathode of the light emitting diode 162$a$ is connected at the other end to the anode of the diode 893. The resistor 164 is connected at one end to the power supply terminal 290 and at the other end to the SI terminal of the controller 890 and the collector of the phototransistor 162$b$. The emitter of the phototransistor 162$b$ is connected to the earth terminal 291.

The switcher 870 has the same configuration as the switcher 170 described in Embodiment 1 and comprises the photocoupler 171, the resistor 172, and the resistor 173. The resistor 172 connected at one end to the emitter of the phototransistor 171*b* is connected at the other end to the anode of the diode 893. The cathode of the light emitting diode 171*a* is connected to the earth terminal 291. The resistor 173 connected at one end to the SO terminal of the controller 890 is connected at the other end to the anode of the light emitting diode 171*a*.

Operation of the communication system according to this embodiment will be described next. In the communication system according to this embodiment, the communication device 900 and each of the communication devices 800, 4300, 4400, and 4500 communicate in an asynchronous communication mode. Moreover, the communication device 900 communicates with each of the communication devices 800, 4300, 4400, and 4500 while switching the other party of communication in a time sharing manner. The communication device 900 gives identification information to each of the communication devices 800, 4300, 4400, and 4500. The identification information given to each of the communication devices 800, 4300, 4400, and 4500 comprises, for example, address information different from each other.

In the communication system 4000, when a reference number or lower number of communication devices are connected to the communication device 900, only the photocoupler 171 of the adjuster 880 provided to any one of the communication devices receiving data from the communication device 900 is put in the ON state.

For transmitting data to the communication device 800, the communication device 900 transmits a transmission advance notice signal giving advance notice of data transmission to the communication device 800 based on the identification information given to the communication device 800. On the other hand, when the communication device 800 receives the transmission advance notice signal, the determiner 860 of the communication device 800 determines the number of connected devices. When the number of connected devices determined by the determiner 860 is equal to or less than a reference number of devices, the communication device 800 puts the photocoupler 171 in the ON state. On the other hand, when the communication device 800 receives the transmission advance notice signal and the number of connected devices determined by the determiner 860 is higher than a reference number of devices, the communication device 800 keeps the photocoupler 171 in the OFF state. Moreover, for transmitting data to the communication device 4300, the communication device 900 transmits a transmission advance notice signal to the communication device 4300 based on the identification information given to the communication device 4300. Moreover, when the communication device 4300 receives the transmission advance notice signal, the communication device 4300 also switches the photocoupler 171 to the ON state or to the OFF state according to the number of connected devices as the communication device 800 does.

According to this embodiment, for example, it is assumed that the communication device 900 is installed at a place where it is relatively difficult to conduct maintenance works (for example, outdoor) and the communication devices 800, 4300, 4400, and 4500 are installed at places where it is relatively easy to conduct maintenance works (for example, indoor). In such a case, for example when the Zener diode 161 has to be replaced with one of a different specification due to change in wiring of the signal line 520 and the like, the workload required to replace the Zener diode 161 can be reduced.

(Embodiment 6)

Figure 17:
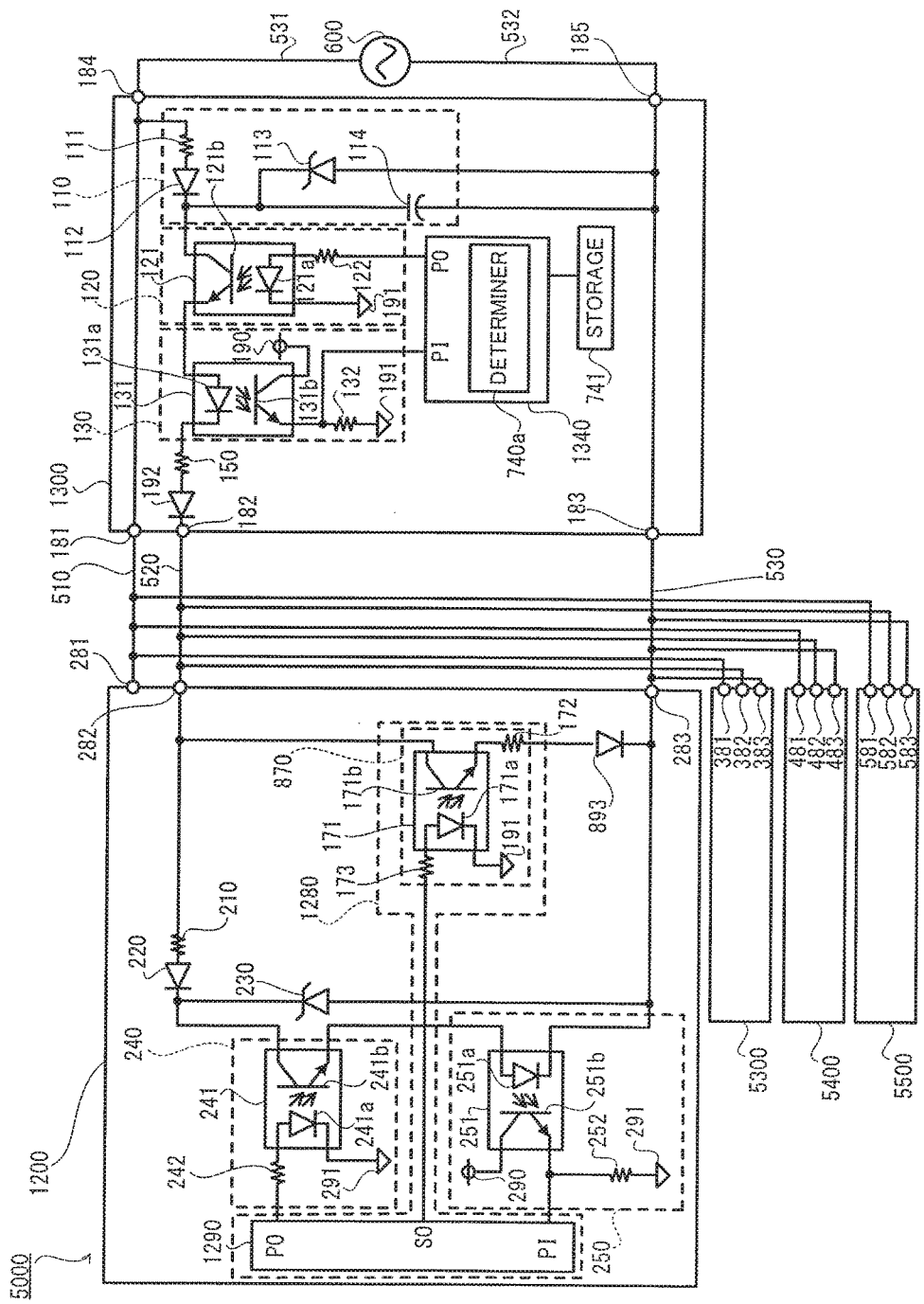
FIG. 17 is a configuration diagram of the communication system according to Embodiment 6.

The communication system according to this embodiment adjusts the line-to-line impedance in a communication device comprising no direct current power supply. As shown in FIG. 17, a communication system 5000 according to this embodiment is different from Embodiment 3 in that a communication device 1300 supplying a communication current comprises the determiner 740*a* and communication devices 1200, 5300, 5400, and 5500 supplied with a communication current from the communication device 1300 comprise an adjuster 1280. The communication devices 5300, 5400, and 5500 all have the same configuration as the communication device 1200. In FIG. 17, the same components as in Embodiment 3 are given the same reference numbers as in FIG. 11. The communication device 1300 determines the number of communication devices connected to the communication device 1300 in the same manner as in Embodiment 3.

A controller 1340 functions as the determiner 740*a* determining the number of communication devices connected to the communication device 1300 by reading a program stored in the storage 741 and executing the data transmission procedure as in Embodiment 3. The controller 1340 comprises a PO terminal outputting a voltage of the level H or the level L and a PI terminal into which a voltage of the level H or the level L is entered. The communication device 1200 controls the photocoupler 171 based on an instruction signal received from the communication device 1300.

In the communication system according to this embodiment, the communication device 1300 and each of the communication devices 1200, 5300, 5400, and 5500 communicate in an asynchronous communication mode. Moreover, the communication device 900 communicates with each of the communication devices 1200, 5300, 5400, and 5500 while switching the other party of communication in a time sharing manner. The communication device 1300 gives identification information to each of the communication devices 1200, 5300, 5400, and 5500. The identification information given to each of the communication devices 1200, 5300, 5400, and 5500 comprises, for example, address information different from each other.

Figure 18:
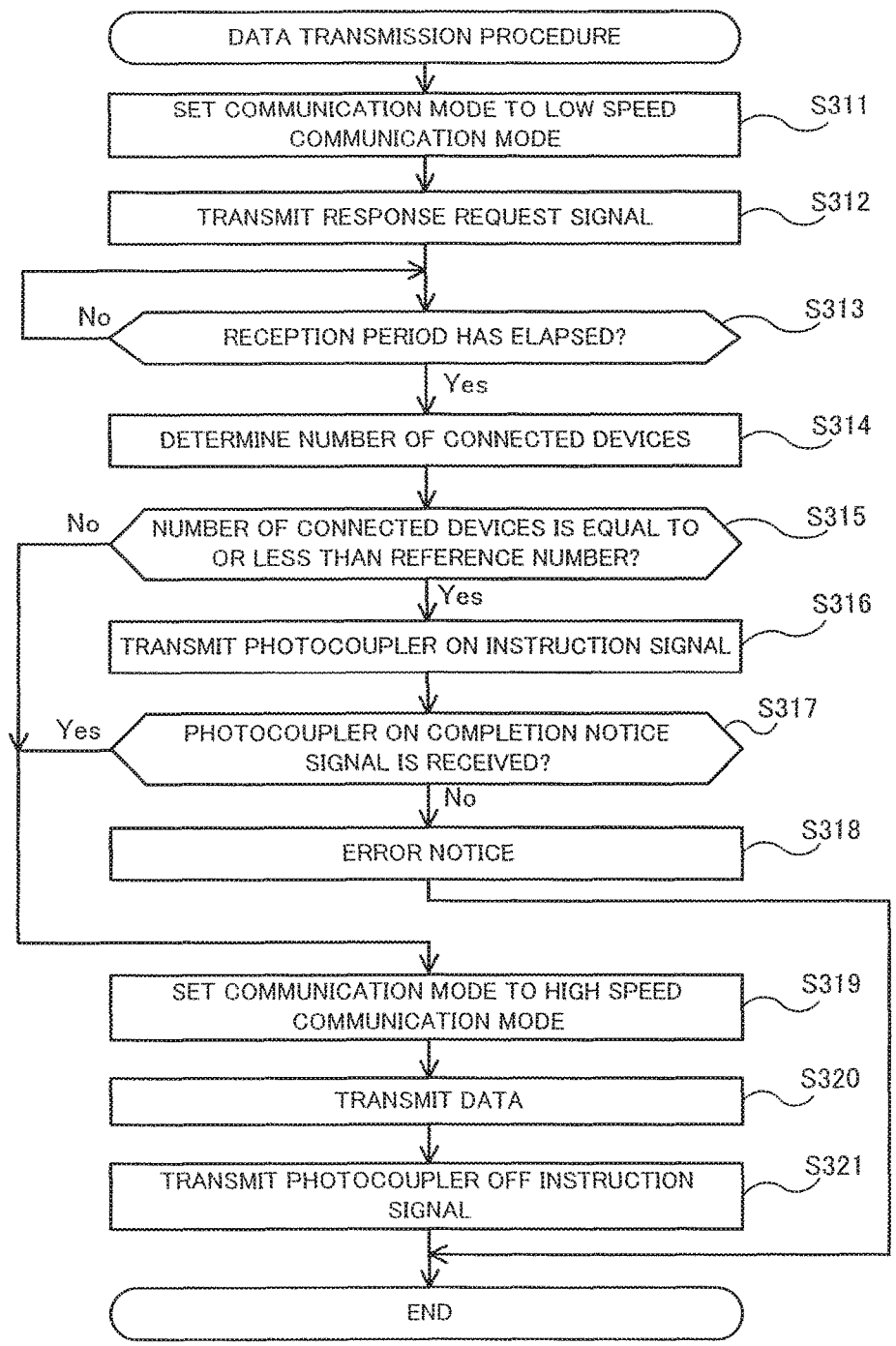
FIG. 18 is a flowchart showing the data transmission procedure executed by the controller of the communication device according to Embodiment 6(A)

The data transmission procedure executed by the controller 1340 of the communication device 1300 according to this embodiment will be described next with reference to FIGS. 18 and 19. In FIG. 18, the processing of Steps S311 to S315, S319, and S320 is the same processing as the processing of Steps S11 to S5, S17, and S18 in FIG. 12 of Embodiment 3. Moreover, in FIG. 19, the processing of Steps S411 to S415 is the same processing as that of Steps S101 to S105 in FIG. 14 of Embodiment 3.

In the communication system 5000, when a reference number or lower number of communication devices are connected to the communication device 1300, only the photocoupler 171 of the adjuster 1280 provided to one of the communication devices receiving data from the communication device 1300 is put in the ON state.

First, the controller 1340 executes the processing of Steps S311 to S315. Then, if judged that the number of connected devices is equal to or less than a reference number of devices in Step S315 (Step S315: Yes), the controller 1340 transmits a photocoupler ON instruction signal to put the photocoupler 171 in the ON state to the communication device 1200 (Step S316). Here, the controller 1340 transmits the photocoupler ON instruction signal to the communication device 1200 based on the identification information.

For example as shown in FIG. 19, in the communication device 1300, if the controller 1340 judges that the number of connected devices is equal to or less than a reference number of devices (Step S415), a photocoupler ON instruction signal is transmitted by the communication device 1300 to the communication device 1200 (Step S416). On the other hand, receiving the photocoupler ON instruction signal, the communication device 1200 puts the photocoupler 171 in the ON state (Step S417). Subsequently, a photocoupler ON completion notice signal to notify that the photocoupler 171 is put in the ON state is transmitted by the communication device 1200 to the communication device 1300 (Step S418).

Returning to FIG. 18, the controller 1340 judges whether a photocoupler ON completion notice signal is received within a preset reception period (Step S317). If a photocoupler ON completion notice signal is not received within a preset reception period in Step S317 (Step S317: No), the controller 1340 gives notice of an error via, for example, a user interface (not shown) provided to the communication device 1200 or the communication device 1300 (Step S318).

On the other hand, if a photocoupler ON completion notice signal is received within a preset reception period in Step S317 (Step S317: Yes), the controller 1340 executes the processing of Steps S319 and S320 to transmit data. After completing data transmission (Step S320), the controller 1340 transmits a photocoupler OFF instruction signal to put the photocoupler 171 in the OFF state to the communication device 1200 (Step S321).

For example as shown in FIG. 19, in the communication device 1300, if judged that a photocoupler ON completion notice signal is received (Step S419), the controller 1340 sets the communication mode to the high speed communication mode (Step S420). Subsequently, data are transmitted by the communication device 1300 to the communication devices (for example, 1200 and 300) connected to the communication device 1300 in the high speed communication mode (Step S421). After completing data transmission, a photocoupler OFF instruction signal is transmitted by the communication device 1300 to the communication device 1200 (Step S422). Receiving the photocoupler OFF instruction signal, the communication device 1200 puts the photocoupler 171 in the OFF state (Step S423).

The communication device 1300 transmits data to the communication devices 5300, 5400, and 5500 in the same manner as the communication device 1300 transmitting data to the communication device 1200. In other words, the communication device 1300 transmits a photocoupler ON instruction signal only to the communication device of the transmission destination of data and the communication device of the transmission destination of data puts the photocoupler in the ON state based on the photocoupler ON instruction signal as the communication device 1200 does.

According to the present embodiment, for example, it is assumed that the communication device 1300 is installed at a place where it is relatively difficult to conduct maintenance works (for example, outdoor) and the communication devices 1200, 5300, 5400, and 5500 are installed at places where it is relatively easy to conduct maintenance works (for example, indoor). In such a case, the task of changing the content of the data transmission procedure program stored in the storage 741 for changing the reference number of devices can be done at a place where it is easy to conduct maintenance works, whereby the workload can be reduced.

Embodiments of the present disclosure are described above. However, the present disclosure is not confined to the above embodiments.

For example, in Embodiment 1, the determiner 160 may have the resistor 163 and a current sensor (not shown) using a hole element and the like and outputting to the SI terminal of the controller 140 a voltage corresponding to the current value of a current flowing through the resistor 163. Alternatively, the determiner 160 may have the resistor 163 and an insulating amplifier outputting to the SI terminal of the controller 140 a voltage corresponding to the magnitude of a voltage occurring between the ends of the resistor 163. With such configurations, the controller 140 can determine the number of communication devices connected to the communication device 100 based on the magnitude of a voltage entered by the current sensor or the insulating amplifier. Moreover, when the voltage entered into the SI terminal by the current sensor or the insulating amplifier is a voltage uniquely determined for a number of connected devices, the controller 140 can distinguish all and detect the number of connected devices based on the voltage entered into the SI terminal.

In the communication system according to Embodiment 3, the case is described in which the communication mode is set to a low speed communication mode for transmission and reception of a response request signal and a response signal. However, the configuration to transmit/receive a response request signal and a response signal in a low speed communication mode is not necessarily restrictive. For example, it may be possible to include hamming codes or the like in the response request signal and the response signal while transmission and reception of the response request signal and the response signal in a high speed communication mode. Then, the controller 740 of the communication device 700 may be made capable of executing an error correction procedure based on the hamming codes or the like. Also in such a case, the noise resistance in transmission and reception of the response request signal and the response signal can be improved.

In Embodiment 5, the case is described in which only the photocoupler 171 of the switcher 870 provided to one communication device receiving a transmission advance notice signal is put in the ON state when the number of communication devices connected to the communication device 900 is equal to or less than a reference number of devices. This is not restrictive. For example, the photocoupler 171 of the adjuster 880 of one predetermined communication device (for example, the communication device 80X)) among the communication devices connected to the communication device 900 may be put in the ON state when the number of connected devices is equal to or less than a reference number of devices.

In Embodiment 6, the case is described in which the controller 1340 of the communication device 1300 transmits a photocoupler ON instruction signal to the communication device connected to the communication device 1300 if judged that the number of communication devices connected to the communication device 1300 is equal to or less than a reference number of devices. This is not restrictive. The controller 1340 may have a configuration in which the controller 1340 transmits to the communication device connected to the communication device 1300 a signal of notice of equal to or lower than a reference number of devices to give notice of equal to or lower than a reference number of devices if judged that the number of connected devices is equal to or less than a reference number of devices. The communication device 1340 transmits the signal of notice of equal to or lower than a reference number of devices only to one communication device of the other party to which the communication device 1300 transmits data. For example, when the communication device 1300 transmits data to the communication device 1200, receiving a signal of notice of equal to or lower than a reference number of devices, the controller 1290 of the communication device 1200 puts the photocoupler 171 in the ON state at the time for the communication device 1300 to transmit data. Then, the controller 1290 puts the photocoupler 171 in the OFF state again after the communication device 1300 completes data transmission.

The controller 1340 may broadcast the signal of notice of equal to or lower than a reference number of devices to all communication devices connected to the communication device 1300). In such a case, the controller 1340 transmits the signal of notice of equal to or lower than a reference number of devices with the inclusion of identification information of a communication device of which the photocoupler 171 is put in the ON state. Then, only in the communication device corresponding to the identification information included in the signal of notice of equal to or lower than a reference number of devices among all communication devices having received the signal of notice of equal to or lower than a reference number of device, the controller puts the photocoupler 171 in the ON state.

In Embodiment 6, the case is described in which the controller 1340 transmits the photocoupler ON instruction signal only to the other party to which the communication device 1300 transmits data. This is not restrictive. The controller 1340 may broadcast the photocoupler ON instruction signal to all communication devices connected to the communication device 1300. In such a case, the controller 1340 transmits the photocoupler ON instruction signal with the inclusion of identification information of a communication device of which photocoupler 171 is put in the ON state.

For example, receiving the photocoupler ON instruction signal, each communication device connected to the communication device 1300 puts the photocoupler 171 in the ON state when the identification information included in the received photocoupler ON instruction signal matches the identification information given to its own device. Then, the communication device having put the photocoupler 171 in the ON state puts the photocoupler 171 in the OFF state after the communication device 1300 completes data transmission.

Moreover, in Embodiment 6, the case is described in which the communication device 900 transmits identification information to the communication devices 800, 4300, 4400, and 4500 in the communication mode described in Embodiment 3. This is not restrictive. The communication device 900 may have a configuration in which the communication device 900 transmits identification information to the communication devices 800, 4300, 4400, and 4500 in the communication mode described in Embodiment 4.

Moreover, the above embodiments are described on the assumption that the communication device comprising the direct current power supply 110 is an outdoor unit and the communication devices comprising no direct current power supply are indoor units. However, for example, it may be possible that any of the indoor units comprises the direct current power supply 110 and the outdoor unit and the other communication devices comprise no direct current power supply.

Moreover, in the above embodiments, the case is described in which a photocoupler is used as the switching element assembled into the current loop. Other switching elements may be used. Such switching elements include, for example, bipolar transistors, FETs, and the like.

Moreover, the various functions of the controller of the communication device according to the present disclosure can be realized by using a conventional computer system, not a dedicated system. For example, the controller executing the above-described procedures may be configured on a computer connected to a network by saving and distributing the programs for executing the above-described operations on a non-transitory recording medium readable by a computer system (CD-ROM and the like) and installing the program in the computer system.

Moreover, the programs are provided to the computer by any method. For example, the programs are uploaded to a bulletin board system (BBS) on a communication line and distributed to the computer via the communication line. Then, the computer activates and executes the programs under the control of an OS in a similar manner to other applications. As a result, the computer functions as the controller executing the procedures described in the embodiments.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure is preferable for communication systems comprising devices connected by a three-core cable (a power line, a signal line, and a common line) and of which power supply and data communication are done by the same cable.

The invention claimed is:
1. A communication system comprising:
a first communication device; and
one or more second communication devices connected to the first communication device by a signal line, a common line and a power line, the one or more second communication devices being connected in parallel with each other with respect to the first communication device when a number of the one or more second communication devices is two or more,
wherein
the first communication device comprises
a direct current power supply configured to generate a direct current for serial communication from alternating current power supplied from an alternating current power supply through the power line and the common line, and pass the generated direct current through a current loop comprising the signal line and the common line that are connected in series, and
a transmitter configured to transmit data by control of a current flowing through the current loop,
the one or more second communication devices each comprise a receiver configured to receive data by detection of the current flowing through the current loop,
at least one device among the first communication device and the one or more second communication devices further comprises an adjuster configured to adjust impedance between the signal line and the common line based on the number of the one or more second communication devices, and the adjuster comprises a switcher configured to switch, in a case in which data is transmitted from the first communication device to the one or more second communication devices, a state between the signal line and the common line to (i) a state of connection via a first load resistor when the number of the one or more second communication devices is equal to or less than a reference number and (ii) a state of disconnection via the first load resistor when the number of the one or more second communication devices exceeds the reference number.

2. The communication system according to claim 1, wherein the adjuster further comprises
a determiner configured to determine the number of the one or more second communication devices based on a voltage between the signal line and the common line, and
the switcher is configured to switch, based on the number determined by the determiner, the state between the signal line and the common line between (i) the state of connection via the first load resistor and (ii) the state of disconnection via the first load resistor.

3. The communication system according to claim 1, wherein the adjuster further comprises
a determiner configured to determine the number of the one or more second communication devices based on a current flowing through a circuit element connected between the signal line and the common line, and
the switcher is configured to switch, based on the number determined by the determiner, the state between the signal line and the common line between (i) the state of connection via the first load resistor and (ii) the state of disconnection via the first load resistor.

4. The communication system according to claim 1, wherein the adjuster is configured to adjust the impedance between the signal line and the common line so that the impedance between the signal line and the common line is within a preset range regardless of the number of the one or more second communication devices.

5. The communication system according to claim 1, wherein the first communication device further comprises a receiver configured to receive data by detection of the current flowing through the current loop,
the one or more second communication devices each further comprise a transmitter configured to transmit data by control of the current flowing through the current loop,
the adjuster further comprises
a determiner configured to
cause the transmitter of the first communication device to transmit a response request signal to each of the one or more second communication devices, and
determine the number of the one or more second communication devices based on a response signal to the response request signal, the response signal being transmitted by the transmitter of each of the one or more second communication devices and being received by the receiver of the first communication device,
the switcher is configured to switch, based on the number determined by the determiner, the state between the signal line and the common line between (i) the state of connection via the first load resistor and (ii) the state of disconnection via the first load resistor, and
noise resistance in a second communication mode used in transmission and reception of the response request signal and the response signal is higher than noise resistance in a first communication mode used in transmission and reception of data other than the response request signal and the response signal.

6. The communication system according to claim 5, wherein the second communication mode is a communication mode in which a number of sampling times per bit of data for transmission and reception is higher than in the first communication mode and a content of one bit of the data for transmission and reception is determined based on a ratio of a number of times of detection as one bit level of two bit levels relative to the number of sampling times per bit.

7. A communication system comprising:
a first communication device; and
one or more second communication devices connected to the first communication device by a signal line, a common line and a power line, the one or more second communication devices being connected in parallel with each other with respect to the first communication device when a number of the one or more second communication devices is two or more,
wherein
the first communication device comprises
a direct current power supply configured to generate a direct current for serial communication from alternating current power supplied from an alternating current power supply through the power line and the common line, and pass the generated direct current through a current loop comprising the signal line and the common line that are connected in series, and
a transmitter configured to transmit data by control of a current flowing through the current loop,
the one or more second communication devices each comprise a receiver configured to receive data by detection of the current flowing through the current loop,
at least one device among the first communication device and the one or more second communication devices further comprises an adjuster configured to adjust impedance between the signal line and the common line based on the number of the one or more second communication devices,
the adjuster comprises a switcher configured to switch, based on the number of the one or more second communication devices, a state between the signal line and the common line between (i) a state of connection via a first load resistor and (ii) a state of disconnection via the first load resistor,
the adjuster further comprises a determiner configured to determine the number of the one or more second communication devices based on a voltage between the signal line and the common line, the switcher is configured to switch, based on the number determined by the determiner, the state between the signal line and the common line between (i) the state of connection via the first load resistor and (ii) the state of disconnection via the first load resistor, the determiner comprises a Zener diode and a first photocoupler that are connected in series between the signal line and the common line, the determiner is configured to determine that the number of the one or more second communication devices is equal to or less than a reference number when the first photocoupler is conductive and determine that the number of the one or more second communication devices exceeds the reference number when the first photocoupler is non-conductive, and the switcher is configured to
switch the state between the signal line and the common line to the state of connection via the first load resistor when the number of the one or more second communication devices is determined to be equal to or less than the reference number by the determiner, and switch the state between the signal line and the common line to the state of disconnection via the first load resistor when the number of the one or more second communication devices is determined to exceed the reference number.

8. A communication system comprising:
a first communication device; and
one or more second communication devices connected to the first communication device by a signal line, a common line and a power line, the one or more second communication devices being connected in parallel with each other with respect to the first communication device when a number of the one or more second communication devices is two or more,
wherein
the first communication device comprises
a direct current power supply configured to generate a direct current for serial communication from alternating current power supplied from an alternating current power supply through the power line and the common line, and pass the generated direct current through a current loop comprising the signal line and the common line that are connected in series, and
a transmitter configured to transmit data by control of a current flowing through the current loop,
the one or more second communication devices each comprise a receiver configured to receive data by detection of the current flowing through the current loop,
at least one device among the first communication device and the one or more second communication devices further comprises an adjuster configured to adjust impedance between the signal line and the common line based on the number of the one or more second communication devices,
the adjuster is configured to adjust the impedance between the signal line and the common line so that the impedance between the signal line and the common line is within a preset range regardless of the number of the one or more second communication devices,
the adjuster comprises a plurality of series circuits each comprising a second load resistor and a second photocoupler that are connected in series between the signal line and the common line, and the adjuster is configured to allow the second photocoupler of a series circuit of the plurality of series circuits to be conductive, the second photocoupler being selected based on the number of the one or more second communication devices.

9. The communication system according to claim 8, wherein
the adjuster further comprises
a determiner configured to determine the number of the one or more second communication devices based on a voltage between the signal line and the common line.

10. The communication system according to claim 8, wherein
the adjuster is configured to adjust the impedance between the signal line and the common line so that the impedance between the signal line and the common line is within a preset range regardless of the number of the one or more second communication devices.

11. A first communication device for serial communication with one or more second communication devices, the first communication device comprising:
a direct current power supply configured to generate a direct current for serial communication from alternating current power supplied from an alternating current power supply through a power line and a common line, and pass the generated direct current through a current loop comprising a signal line and the common line that are connected in series;
a transmitter configured to transmit data by control of a current flowing through the current loop; and
an adjuster configured to adjust impedance between the signal line and the common line based on a number of the one or more second communication devices,
wherein the one or more second communication devices are connected in parallel to the first communication device by the signal line, the common line and the power line,
wherein the one or more second communication devices are connected in parallel with each other with respect to the first communication device when the number of the one or more second communication devices is two or more, and
wherein the adjuster comprises a switcher configured to switch, in a case in which data is transmitted from the first communication device to the one or more second communication devices, based on the number of the one or more second communication devices, a state between the signal line and the common line to (i) a state of connection via a first load resistor when the number of the one or more second communication devices is equal to or less than a reference number and (ii) a state of disconnection via the first load resistor when the number of the one or more second communication devices exceeds the reference number.

12. The first communication device according to claim 11, wherein
the adjuster further comprises
a determiner configured to determine the number of the one or more second communication devices based on a voltage between the signal line and the common line, and
the switcher is configured to switch, based on the number determined by the determiner, the state between the signal line and the common line between (i) the state of connection via the first load resistor and (ii) the state of disconnection via the first load resistor.

13. The first communication device according to claim 11, wherein
the adjuster is configured to adjust the impedance between the signal line and the common line so that the impedance between the signal line and the common line is within a preset range regardless of the number of the one or more second communication devices.

14. A second communication device that is any of one or more second communication devices connected to a first communication device by a signal line, a common line and a power line, the one or more second communication devices being connected in parallel with each other with respect to the first communication device when a number of the one or more second communication devices is two or more, the first communication device including a direct current power supply configured to generate direct current power for serial communication from alternating current power supplied from an alternating current power supply, the second communication device comprising:
a receiver configured to receive data by detection of a current flowing through a current loop comprising the signal line and the common line that are connected in series; and
an adjuster configured to adjust impedance between the signal line and the common line based on the number of the one or more second communication devices,
wherein the adjuster comprises a switcher configured to switch, in a case in which data is transmitted from the first communication device to the one or more second communication devices, based on the number of the one or more second communication devices, a state between the signal line and the common line to (i) a state of connection via a first load resistor when the number of the one or more second communication devices is equal to or less than a reference number and (ii) a state of disconnection via the first load resistor when the number of the one or more second communication devices exceeds the reference number.

15. The second communication device according to claim 14, wherein
the adjuster further comprises a determiner configured to determine the number of the one or more second communication devices based on a voltage between the signal line and the common line,
the switcher configured to switch, based on the number determined by the determiner, the state between the signal line and the common line between (i) the state of connection via the first load resistor and (ii) the state of disconnection via the first load resistor,
the determiner comprises a Zener diode and a first photocoupler that are connected in series between the signal line and the common line,
the determiner is configured to determine that the number of the one or more second communication devices is equal to or less than a reference number when the first photocoupler is conductive and determine that the number of the one or more second communication devices exceeds the reference number when the first photocoupler is non-conductive, and
the switcher is configured to
switch the state between the signal line and the common line to the state of connection via the first load resistor when the number of the one or more second communication devices is determined to be equal to or less than the reference number by the determiner, and
switch the state between the signal line and the common line to the state of disconnection via the first load resistor when the number of the one or more second communication devices is determined to exceed the reference number.

16. The second communication device according to claim 14, wherein
the adjuster further comprises
a determiner configured to determine the number of the one or more second communication devices based on a voltage between the signal line and the common line, and
the switcher is configured to switch, based on the number determined by the determiner, the state between the signal line and the common line between (i) the state of connection via the first load resistor and (ii) the state of disconnection via the first load resistor.

17. The second communication device according to claim 14, wherein
the adjuster is configured to adjust the impedance between the signal line and the common line so that the impedance between the signal line and the common line is within a preset range regardless of the number of the one or more second communication devices.

18. The first communication device according to claim 11, wherein
the adjuster further comprises a determiner configured to determine the number of the one or more second communication devices based on a voltage between the signal line and the common line,
the switcher configured to switch, based on the number determined by the determiner, the state between the signal line and the common line between (i) the state of connection via the first load resistor and (ii) the state of disconnection via the first load resistor,
the determiner comprises a Zener diode and a first photocoupler that are connected in series between the signal line and the common line,
the determiner is configured to determine that the number of the one or more second communication devices is equal to or less than a reference number when the first photocoupler is conductive and determine that the number of the one or more second communication devices exceeds the reference number when the first photocoupler is non-conductive, and
the switcher is configured to
switch the state between the signal line and the common line to the state of connection via the first load resistor when the number of the one or more second communication devices is determined to be equal to or less than the reference number by the determiner, and
switch the state between the signal line and the common line to the state of disconnection via the first load resistor when the number of the one or more second communication devices is determined to exceed the reference number.

19. A first communication device for serial communication with one or more second communication devices, the first communication device comprising:
a direct current power supply configured to generate a direct current for serial communication from alternating current power supplied from an alternating current power supply through a power line and a common line, and pass the generated direct current through a current loop comprising a signal line and the common line that are connected in series;

a transmitter configured to transmit data by control of a current flowing through the current loop; and an adjuster configured to adjust impedance between the signal line and the common line based on a number of the one or more second communication devices, wherein the one or more second communication devices are connected to the first communication device by the signal line, the common line and the power line, the one or more second communication devices are connected in parallel with each other with respect to the first communication device when the number of the one or more second communication devices is two or more, the adjuster is configured to adjust the impedance between the signal line and the common line so that the impedance between the signal line and the common line is within a preset range regardless of the number of the one or more second communication devices, the adjuster comprises a plurality of series circuits each comprising a second load resistor and a second photocoupler that are connected in series between the signal line and the common line, and the adjuster is configured to allow the second photocoupler of a series circuit of the plurality of series circuits to be conductive, the second photocoupler being selected based on the number of the one or more second communication devices.

20. A second communication device that is any of one or more second communication devices connected to a first communication device by a signal line, a common line and a power line, the one or more second communication devices being connected in parallel with each other with respect to the first communication device when a number of the one or more second communication devices is two or more, the first communication device including a direct current power supply configured to generate direct current power for serial communication from alternating current power supplied from an alternating current power supply, the second communication device comprising:

a receiver configured to receive data by detection of a current flowing through a current loop comprising the signal line and the common line that are connected in series; and an adjuster configured to adjust impedance between the signal line and the common line based on the number of the one or more second communication devices, wherein the adjuster is configured to adjust the impedance between the signal line and the common line so that the impedance between the signal line and the common line is within a preset range regardless of the number of the one or more second communication devices, the adjuster comprises a plurality of series circuits each comprising a second load resistor and a second photocoupler that are connected in series between the signal line and the common line, and the adjuster is configured to allow the second photocoupler of a series circuit of the plurality of series circuits to be conductive, the second photocoupler being selected based on the number of the one or more second communication devices.

* * * * *